(12) United States Patent
Nagaseki

(10) Patent No.: US 8,242,026 B2
(45) Date of Patent: Aug. 14, 2012

(54) SEMICONDUCTOR DEVICE MANUFACTURING METHOD, SEMICONDUCTOR MANUFACTURING APPARATUS AND STORAGE MEDIUM

(75) Inventor: Sumie Nagaseki, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 481 days.

(21) Appl. No.: 12/522,772

(22) PCT Filed: Dec. 21, 2007

(86) PCT No.: PCT/JP2007/074669
§ 371 (c)(1),
(2), (4) Date: Jul. 10, 2009

(87) PCT Pub. No.: WO2008/084658
PCT Pub. Date: Jul. 17, 2008

(65) Prior Publication Data
US 2010/0003807 A1   Jan. 7, 2010

(30) Foreign Application Priority Data

Jan. 10, 2007   (JP) .................................. 2007-002733

(51) Int. Cl.
*H01L 21/302* (2006.01)

(52) U.S. Cl. ........ 438/745; 438/514; 438/528; 438/692; 438/758; 205/687; 205/701; 205/742; 205/746; 205/770; 210/639; 210/695; 210/739; 257/E21.219

(58) Field of Classification Search .................... None
See application file for complete search history.

(56) References Cited

U.S. PATENT DOCUMENTS

| 6,209,855 B1 * | 4/2001 | Glassford ..................... 261/28 |
| 2005/0227115 A1 | 10/2005 | Nomura et al. |
| 2006/0054191 A1 | 3/2006 | Higuchi et al. |
| 2006/0054205 A1 | 3/2006 | Yabe et al. |
| 2007/0189972 A1 | 8/2007 | Chiba et al. |

FOREIGN PATENT DOCUMENTS

| JP | 2004 121962 | 4/2004 |
| JP | 2005 245817 | 9/2005 |
| JP | 2006 147617 | 6/2006 |
| WO | 2003 086615 | 10/2003 |

* cited by examiner

*Primary Examiner* — Kyoung Lee
(74) *Attorney, Agent, or Firm* — Oblon, Spivak, McClelland, Maier & Neustadt, L.L.P.

(57) ABSTRACT

Provided is a method for performing etching process or film forming process to a substrate W whereupon a prescribed pattern is formed with an opening. The method is provided with a step of mixing a liquid and a gas, at least one of which contains a component that contributes to the etching process or the film forming process, and generating charged nano-bubbles 85 having a diameter smaller than that of the opening formed on the semiconductor substrate W; a step of forming an electric field to attract the nano-bubbles onto the surface of the substrate W; and a step of performing the process by supplying the substrate with the liquid containing the nano-bubbles 85 while forming the electric field.

16 Claims, 16 Drawing Sheets

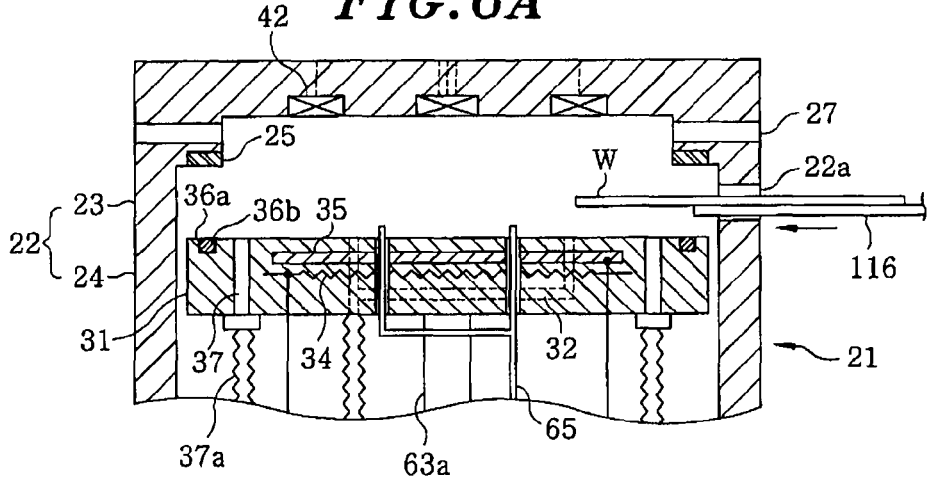
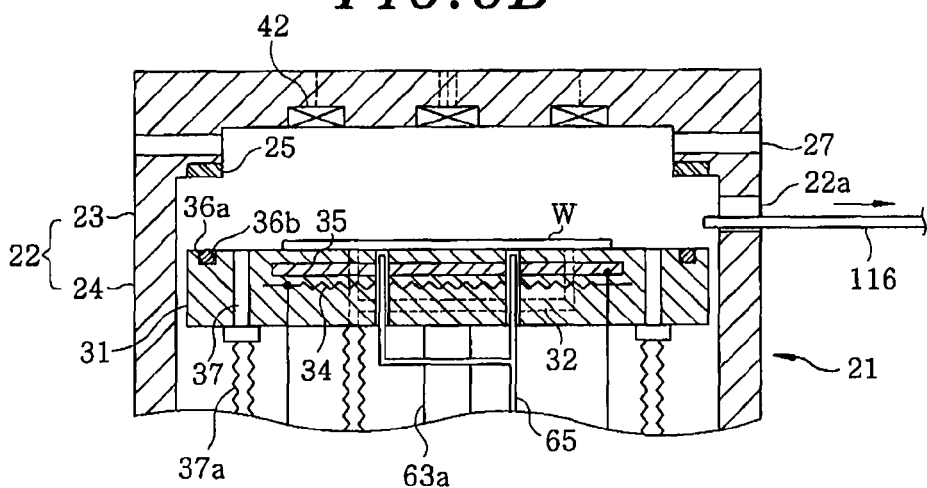
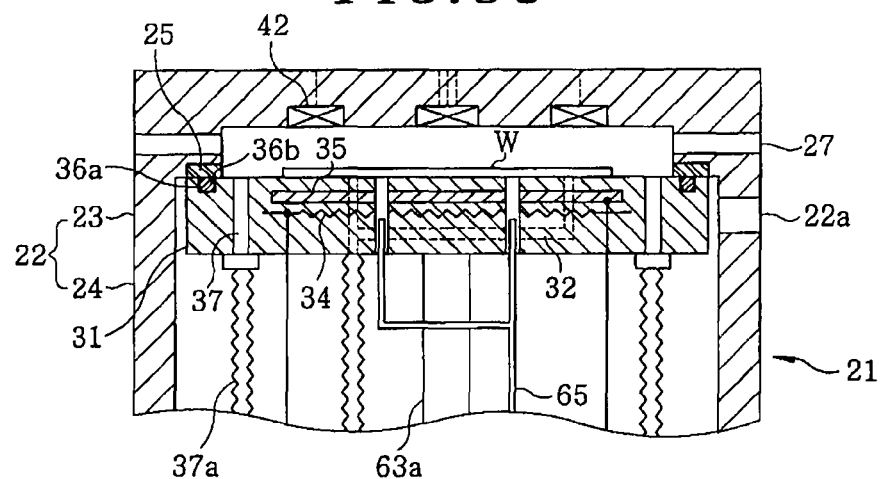

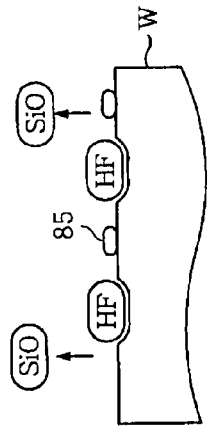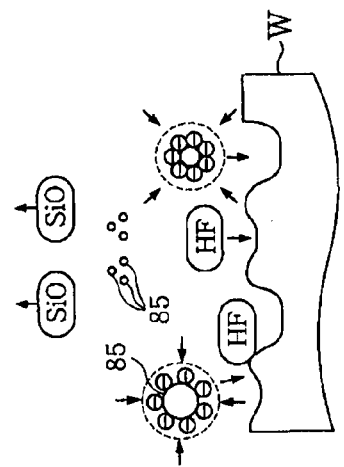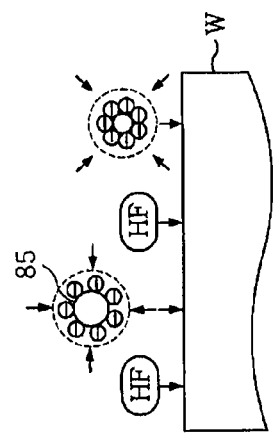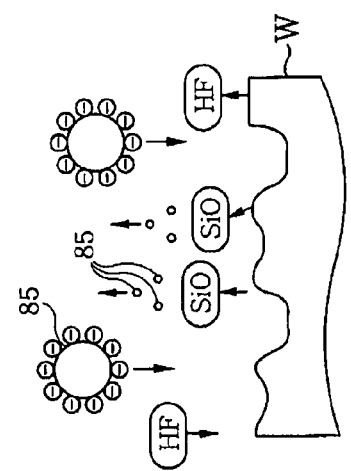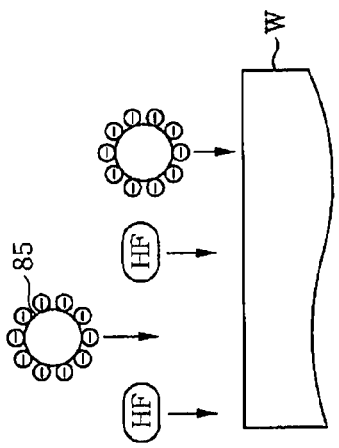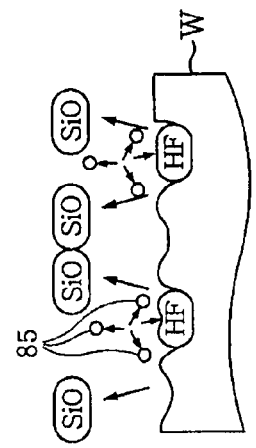

SEMICONDUCTOR DEVICE MANUFACTURING METHOD, SEMICONDUCTOR MANUFACTURING APPARATUS AND STORAGE MEDIUM

CROSS-REFERENCE TO RELATED APPLICATIONS

This international application claims priority to Japanese Patent Application No. 2007-2733, filed on Jan. 10, 2007, the entire contents of which are hereby incorporated by reference.

FIELD OF THE INVENTION

The present invention relates to a semiconductor device manufacturing method for performing a film forming process or an etching process on a substrate in a processing vessel by supplying a liquid and a gas, at least one of which contains components contributing to the etching process or the film forming process; a semiconductor manufacturing apparatus; and a storage medium which stores the manufacturing method therein.

BACKGROUND OF THE INVENTION

In a manufacturing method of semiconductor devices, a plasma process as a dry process for processing a substrate by using plasma of a processing gas is performed to carry out a film forming process or an etching process on the substrate. In the plasma process, the plasma of the processing gas is attracted onto the substrate so that high anisotropy can be obtained and the process can be performed even inside a pattern with a narrow opening width. However, since it takes a long time to complete the process due to a low processing speed, the processing speed needs to be improved. Furthermore, damage to a device due to an abnormal discharge or a charging damage in the substrate charged by the plasma has been a serious problem yet to be solved.

Further, since such plasma process is performed in a high-vacuum processing vessel, expensive peripheral equipment such as a dry pump, a turbo molecular pump or the like needs to be installed therewith. Moreover, since the processing vessel needs to have a pressure-resistant structure and the size of the processing vessel keeps increasing due to the enlargement of a substrate size, apparatus manufacturing cost is expected to keep further rising.

In addition, the increase in the substrate size makes it difficult to maintain in-plane process uniformity of the substrate. Thus, there has been an increasing demand for an alternative process to the conventional dry process such as the plasma process.

Meanwhile, for instance, in a wet process for processing a substrate by immersing the substrate in a processing solution, high in-plane process uniformity of the substrate can be achieved without any risk such as a charging damage in a device or the like. Further, since such wet process is performed under an atmospheric pressure, equipment can be manufactured at a low cost. However, a reaction by the processing liquid progresses isotropically, and thus, it is difficult to form a pattern with a high aspect ratio through an anisotropic process, e.g., etching. Moreover, since it is difficult to flow the processing liquid into a narrow opening portion, there has been difficulty in applying the wet process to a film forming process for burying a material in such pattern.

Meanwhile, disclosed in Japanese Patent Laid-open Application No. 2004-121962 (paragraphs [0031]~[0037]) is a technology for cleaning industrial equipment or the like by using bubbles of a micrometer (nanometer) scale, so-called micro-bubbles (nano-bubbles), and also disclosed in Japanese Patent Laid-open Application No. 2005-245817 (paragraphs [0012]~[0013]) is a technology for forming the nano-bubbles stably. However, neither of these documents mentions anything about the means for solving the above-stated problems.

SUMMARY OF THE INVENTION

In view of the above, an object of the present invention is to provide a semiconductor device manufacturing method capable of achieving advantages obtained in a wet process as well as advantages obtained in a dry process in performing an etching process or a film forming process on a substrate for use in manufacturing a semiconductor device; a semiconductor manufacturing apparatus; and a storage medium which stores therein a program for performing the manufacturing method.

In accordance with one aspect of the present invention, there is provided a semiconductor device manufacturing method for performing an etching process or a film forming process on a substrate provided with a preset pattern with an opening, for use in a semiconductor device manufacture, the method including the steps of: generating a nano-bubble by mixing a liquid and a gas, at least one of which contains a component contributing to the etching process or the film forming process, the nano-bubble having a diameter smaller than that of the opening formed on the substrate and electrically charged by the mixture of the liquid and the gas; forming an electric field for attracting the nano-bubbles onto a surface of the substrate; and performing the etching process or the film forming process by supplying the liquid containing the nano-bubble onto the substrate while forming the electric field.

The component contributing to the etching process or the film forming process may be a component which generates a material that will function as an active species in the etching process or the film forming process. Further, the electric field for attracting the nano-bubbles onto the surface of the substrate is an electric field for pulling (attracting) the nano-bubble to the substrate when viewed from the substrate side, while it is an electric field for pushing the nano-bubbles into the substrate when viewed from the side opposite to the substrate.

The semiconductor device manufacturing method described above may also include a step of cleaning the substrate by supplying a cleaning solution onto the substrate after the step of performing the etching process or the film forming process is completed.

The semiconductor device manufacturing method described above may further include a step of drying the substrate by supplying a drying gas after the step of cleaning the substrate is completed.

The step of performing the etching process or the film forming process may include transmitting an ultrasonic wave to the liquid.

The step of performing the etching process or the film forming process may include controlling the temperature of the substrate.

The liquid may be made of a solution containing hydrogen fluoride.

When the etching process is performed, the gas may be made of a gas containing carbon and hydrogen.

When the film forming process is performed, the liquid may be made of a solution containing a metal salt, a complexing agent and a reducing agent.

The etching process or the film forming process is performed with a target surface of the substrate facing down.

In accordance with another aspect of the present invention, there is provided a semiconductor manufacturing apparatus for performing an etching process or a film forming process on a substrate provided with a preset pattern with an opening, for use in a semiconductor device manufacture, including: a processing vessel accommodating a mounting table for mounting the substrate thereon; a liquid supply line of which one end is connected to the processing vessel; a nano-bubble generating unit installed in the liquid supply line, for generating a nano-bubble electrically charged in a liquid by mixing a gas with the liquid supplied into the liquid supply line; an electric field generating unit for generating an electric field to attract the nano-bubble in the liquid, which is supplied into the processing vessel from the liquid supply line, onto the surface of the substrate mounted on the mounting table; and a liquid discharge line for discharging the liquid from the processing vessel, wherein at least one of the liquid and the gas contains a component contributing to the etching process or the film forming process.

Here, the component contributing to the etching process or the film forming process may be a component which generates a material that will function as an active species in the etching process or the film forming process. The electric field for attracting the nano-bubble onto the surface of the substrate is an electric field for pulling the nano-bubble toward the substrate or pushing it into the substrate.

The semiconductor manufacturing apparatus described above may also include a cleaning solution supplying unit for supplying a cleaning solution onto the substrate mounted on the mounting table in the processing vessel.

The semiconductor manufacturing apparatus described above may further include a gas supplying unit for supplying a drying gas onto the substrate cleaned by the cleaning solution supplied from the cleaning solution supply unit.

The semiconductor manufacturing apparatus described above may further include an ultrasonic wave transmitting unit for transmitting an ultrasonic wave to the liquid supplied into the processing vessel.

A temperature controller for controlling the temperature of the substrate mounted on the mounting table may be disposed in the processing vessel.

A filter for adjusting the diameter of the nano-bubble passing therethrough may be disposed between the processing vessel and the nano-bubble generating unit.

In accordance with still another aspect of the present invention, there is provided a storage medium which stores therein a computer program for executing, on a computer, a method for performing an etching process or a film forming process on a substrate provided with a preset pattern with an opening, for use in a semiconductor device manufacture, wherein the method for performing the etching process or the film forming process includes the steps of: generating a nano-bubble by mixing a liquid and a gas, at least one of which contains a component contributing to the etching process or the film forming process, the nano-bubble having a diameter smaller than that of the opening formed on the substrate and electrically charged by the mixture of the liquid and the gas; forming an electric field for attracting the nano-bubbles onto a surface of the substrate; and performing the etching process or the film forming process by supplying the liquid containing the nano-bubble onto the substrate while forming the electric field.

In the present invention, the etching process or the film forming process is performed by supplying a liquid, in which nano-bubbles charged with electricity are dispersed, onto the substrate, and the nano-bubbles are attracted toward the substrate by generating the electric field during the process. Accordingly, the liquid is introduced into the pattern onto the substrate along with the nano-bubbles, so that anisotropic processing can be carried out. Thus, a wet process capable of realizing anisotropy, which is an advantage achieved in a dry process, can be carried out. Further, since the present process is a wet process, preparation of a vacuum atmosphere is not required. As described, since advantages obtained in both the dry process and the wet process can be achieved, cost for the apparatus and peripheral equipment can be reduced, and a problem of charging damage can be avoided.

BRIEF DESCRIPTION OF THE DRAWINGS

FIGS. 6A to 6C are longitudinal cross sectional views of the processing vessel, for illustrating a process of loading the substrate into the processing vessel.

FIGS. 8A to 8F are schematic diagrams showing an example of a state of the substrate being etched by a processing solution in the manufacturing method in accordance with the present invention.

DETAILED DESCRIPTION OF THE EMBODIMENT (First Embodiment: Etching by a Processing Solution)

An example of a manufacturing apparatus for performing a first embodiment of a semiconductor device manufacturing method in accordance with the present invention will be described with reference to FIG. 1.

Figure 1:
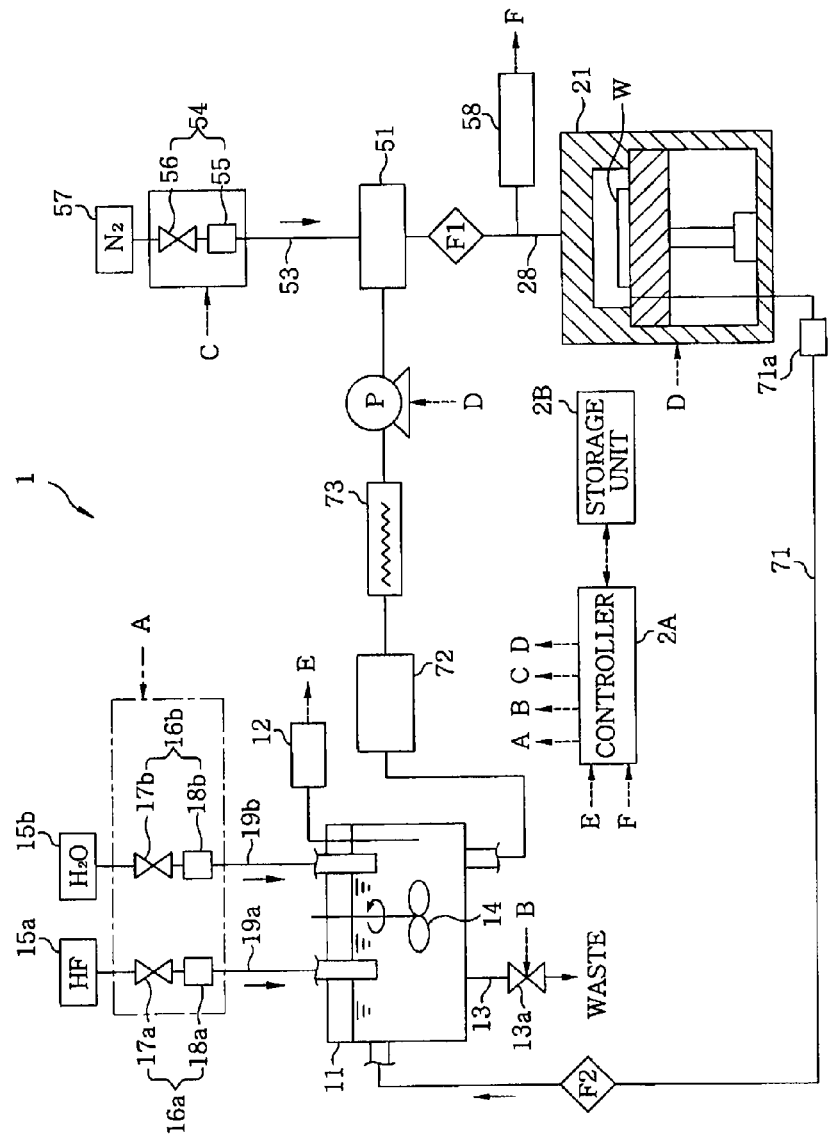
FIG. 1 is a configuration view showing an example of a semiconductor manufacturing apparatus in accordance with the present invention.

FIG. 1 illustrates an overall configuration of a semiconductor manufacturing apparatus 1 in accordance with the present invention, and it includes a mixing tub 11, a deaerator 72, a heater 73, a pressurizing pump P, a nano-bubble generating unit 51, a filter F1 and a processing vessel 21 which are connected in this sequence by a processing solution supply line 28. A liquid such as a processing solution flows through the inside of the processing solution supply line 28.

Further, the processing vessel 21 and the mixing tub 11 are connected with each other by a return line 71 via a filter F2, whereby the processing solution or the like is allowed to return back into the mixing tub 11 from the inside of the processing vessel 21. The processing vessel 21 is drawn to be simplified in FIG. 1.

The deaerator 72 is an apparatus for removing air or a nitrogen gas dissolved in the processing solution by, e.g., distillation to allow nano-bubbles, which is supplied into the processing solution, to be mixed into or dispersed in the processing solution easily in the nano-bubble generating unit 51 to be described later.

The heater 73 adjusts the temperature of the processing solution to thereby control the reactivity of the processing solution with a wafer W.

The pressurizing pump P serves to supply the processing solution into the nano-bubble generating unit 51 after pressurizing the processing solution. The flow rate of the processing solution supplied into the nano-bubble generating unit 51 is adjusted by the pressurizing pump P.

Now, the processing vessel 21 for processing a substrate, e.g., a semiconductor wafer (hereinafter, referred to as a "wafer W") will be explained with reference to FIG. 2. The processing vessel 21 includes a substantially cylindrical housing 22 and a mounting table 31 as a mounting member disposed inside the housing 22. An upper member 23 of the housing 22 is formed in a cylindrical shape having an inner diameter smaller than that of a lower member 24. A ring-shaped insulator 25 provided at a lower portion of the upper member 23 is closely contacted with a periphery portion of the top surface of the mounting table 31, whereby a processing region 26 is formed. Processing solution supply ports 27 for supplying the processing solution are provided at plural positions at the lateral side of the upper member 23. For example, two processing solution supply ports 27 are provided opposite to each other in a diametric direction of the processing vessel 21, and they are connected with the nano-bubble generating unit 51 to be described later via the processing solution supply line 28.

Further, a cleaning solution supply unit 44 is connected to a ceiling of the upper member 23 via a cleaning solution supply line 43. The inside of the processing region 26 is replaced with pure water after the wafer W is processed, so that once the processing of the wafer W is stopped, the wafer W can be cleaned. Further, one end of a gas supply line 29 is connected to a central portion of the ceiling of the upper member 23, and the other end of the gas supply line 29 is connected to a gas supply source 41 serving as a gas supply unit for supplying, e.g., a nitrogen gas.

With this configuration, by supplying, for example, the nitrogen gas to the wafer W after the cleaning process, pure water remaining on the surface of the wafer W can be blown away.

Installed at the ceiling of the upper member 23 are ultrasonic vibrators 42 serving as an ultrasonic wave transmitting unit for transmitting ultrasonic waves of a frequency of, e.g., 100 kHz to plural positions, e.g., to a central portion of the wafer W mounted on the mounting table 31 and four peripheral positions in the wafer W, wherein the four peripheral positions are equally spaced apart on a circumference of the wafer W. The ultrasonic vibrators 42 are connected to a power supply 42a and function to apply ultrasonic vibrations to the processing solution on the surface of the wafer W in a uniform manner.

Further, a transfer port 22a through which the wafer W is transferred is formed at a sidewall of the lower member 24 so as to correspond to a transfer position of the mounting table 31 to be described later.

Formed inside the mounting table 31 is a suction path 32 having plural openings on the surface of the mounting table 31. The suction path 32 is connected to a suction unit 61 such as a vacuum pump via, e.g. an expansible/contractible suction pipe 33 having, e.g., a bellows shape and a bottom surface of the housing 22 so as to attract and hold the wafer W in place. A temperature detection unit (not shown) and a temperature control unit 34 including a heater or a cooling mechanism are embedded in the mounting table 31 to carry out a temperature control of the wafer W on the mounting table 31, and are connected with a power supply 34a.

Further, an electrode 35 connected with a DC or AC power supply 62 is also embedded in the mounting table 31 as a member of an electric field forming mechanism for generating a potential difference of, e.g., 10 V between the wafer W on the mounting table 31 and the ceiling of the upper member 23 throughout the processing region 26. The power supply 62 and the housing 22 are grounded. A ring-shaped groove 36a is formed on a peripheral portion of the top surface of the mounting table 31 along its circumference, and a ring-shaped seal member 36b inserted in the groove 36a allows the mounting table 31 to be firmly adhered to the insulator 25, thereby defining the airtight processing region 26.

Further, liquid discharge paths 37 are formed at plural positions in the mounting table 31 to communicate with outside of a region where the wafer is mounted, e.g., four equispaced positions along a circumference of the wafer W to discharge the liquid such as the processing solution supplied in the processing region 26.

The discharge paths 37 are connected to the return line 71 to be described later via an expansible/contractible discharge tube 37a of, e.g., a bellows shape and the bottom surface of the housing 22. The return line 71 is provided with a mass flow controller 71a for controlling the flow rate of the processing solution discharged from the processing region 26, and it is arranged such that the inside of the processing region 26 can be filled up with the processing solution or the entire supplied processing solution can be discharged after the process is completed.

A gas exhaust pipe 39 is connected to a ceiling portion of the upper member 23 via a vent valve 39a to exhaust a gas inside the processing region 26, such as a nitrogen gas, to the outside when the processing solution is supplied into the processing region 26.

An elevating mechanism 63b is connected to a lower portion of the mounting table 31 via an elevating shaft 63a, whereby the mounting table 31 can be moved up and down between a processing position (upper position) for performing the processing of the wafer W and a transfer position (lower position) for performing a transfer of the wafer W between the processing vessel 21 and the outside. Further, an insulator 64 is interposed between the elevating mechanism 63b and the bottom surface of the housing 22.

Moreover, pins 65 for supporting the wafer W at plural, e.g., three positions from below the wafer W are installed at the bottom surface of the housing 22. The pins 65 are driven through holes 38, which are formed through the mounting table 31, by the elevating mechanism 66 to move the wafer W up and down.

Figure 3A:
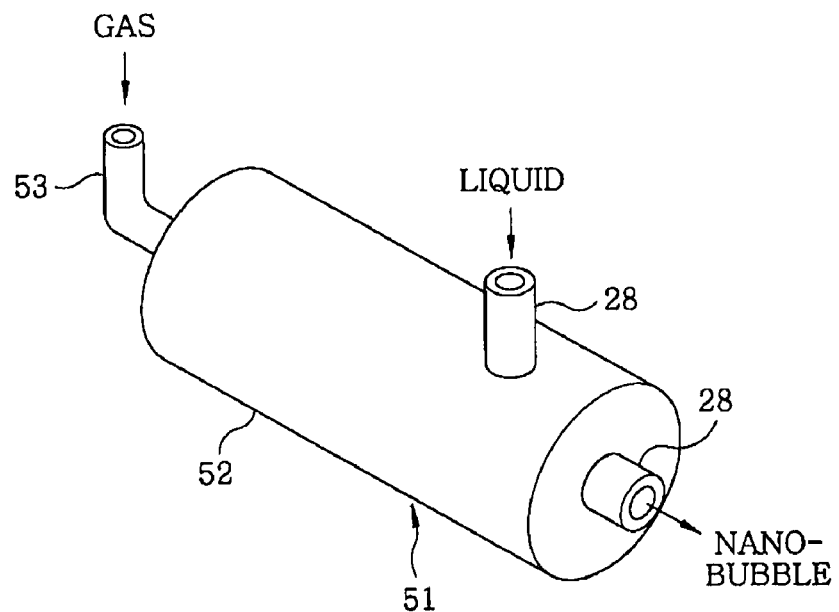
FIGS. 3A and 3B are a plan view showing an example of a nano-bubble generating unit of the manufacturing apparatus.

Next, the nano-bubble generating unit 51 will be described with reference to FIGS. 3A and 3B. The nano-bubble generating unit 51 includes, as shown in FIG. 3A, a cylindrical housing 52, and the processing solution supply line 28 has two parts, wherein a part thereof is connected to a lateral surface (circumferential surface) of the housing 52 while the other is connected to one end of the housing 52. The other end of the housing 52 is connected with a nitrogen gas supply line 53. This nano-bubble generating unit 51 is, for example, a micro nano-bubble generating apparatus manufactured by, e.g., Nanoplanet Research Institute Corporation or the like.

The nano-bubble generating unit 51 is configured to mix a liquid such as the processing solution supplied through the processing solution supply line 28 connected to the circumferential surface of the housing 52 with a gas such as the nitrogen gas as the processing gas supplied from the nitrogen gas supply line 53 to thereby generate tiny gas bubbles (bubbles having a size of a micrometer level or a nanometer level; hereinafter, referred to as "nano-bubbles") having negative charges in the liquid and, then, for discharging the liquid filled with the nano-bubbles through the processing solution supply line 28 at the one end of the housing 52, as will be described later in detail.

As shown in FIG. 1, a nitrogen gas source 57 is connected to the nitrogen gas supply line 53 via a mass flow controller 55 and a valve 56 which function together as a gas supply control unit 54. Further, in this example, the nitrogen gas from the nitrogen gas source 57 is not directly involved in performing an actual processing on the wafer W but is used to generate the nano-bubbles. However, the nitrogen gas is herein called as a "processing gas" because a reaction (processing of the wafer W) between the processing solution and the wafer W is facilitated as a result of the crush of the nano-bubbles, as will be described later.

The filter F1 (see FIG. 1) provided between the nano-bubble generating unit 51 and the processing vessel 21 is for filtering the nano-bubbles based on the diameter of the nano-bubbles generated in the nano-bubble generating unit 51, wherein it removes nano-bubbles having a size equal to or larger than, e.g., 1 μm, and allows nano-bubbles having a smaller size to be supplied into the processing vessel 21.

As for air bubbles having an ordinary normal size, it is difficult to achieve their diameter adjustment by means of the filter F1 because air bubbles tend to cohere due to a surface tension, thereby forming a large aggregation of gas in the solution. The nano-bubbles, however, have a tendency not to cohere but shrink with the lapse of time to thereby finally disappear. Thus, the filter F1 can serve the purpose to select the nano-bubbles based on the diameters thereof.

That is, nano-bubbles with a large diameter captured by the filter F1 later may shrink and pass through the filter F1 or further shrink and finally disappear. For example, a fiber material woven with fibers may be used as the filter F1.

Further, as illustrated in FIG. 1, a gas concentration measuring unit 58 for measuring the concentration of the nitrogen gas is provided in the processing solution supply line 28 between the filter F1 and the processing vessel 21, whereby the concentration of the nitrogen gas in the processing solution passing through the processing solution supply line 28, that is, the density of the nano-bubbles can be measured. If the concentration of the nitrogen gas exceeds an upper limit or falls below a lower limit, the processing of the wafer W is stopped by, for example, a controller 2A to be described later.

The mixing tub 11 is for mixing the processing solution and includes an agitator 14, e.g., agitation blades or the like, for mixing the processing solution in the mixing tub 11. A hydrogen fluoride aqueous solution source 15a is connected to the mixing tub 11 through a hydrogen fluoride supply line 19a via a valve 17a and a mass flow controller 18a serving together as a gas supply controller 16a, and a pure water source 15b is connected to the mixing tub 11 through a pure water supply line 19b via a valve 17b and a gas supply controller 18b serving together as a gas supply controller 16b. The above-stated processing solution supply line 28 is connected to a bottom surface of the mixing tub 11, and the sufficiently mixed processing solution is supplied downstream.

Further, as illustrated in FIG. 1, the above-mentioned return line 71 is connected to the mixing tub 11 via a filter F2, and the processing solution returned from the processing vessel 21 is mixed with a new processing solution supplied from the hydrogen fluoride aqueous solution source 15a and the pure water source 15b.

Further, there is also provided, e.g., a silicon concentration measuring unit 12, e.g., an ICP-Mass (Inductively Coupled Plasma Mass-spectrometer) or the like, for measuring the concentration of one of components, e.g., silicon, dissolved in the processing solution in the processing vessel 21, and the concentration of the silicon dissolved in the processing solution in the mixing tub 11 is measured periodically at a certain interval. When the silicon concentration increases up to a preset level, a valve 13a installed in a waste line 13 connected to a lower portion of the mixing tub 11 is controlled to be opened and closed by the controller 21 to be described later to waste a certain fraction, e.g., 50% of the processing solution stored in the mixing tub 11 from the waste line 13. In such case, the same amount of new processing solution as the wasted processing solution is supplied from the hydrogen fluoride aqueous solution source 15a and the pure water source 15b.

Further, it may be possible to set the above-described replenishment of the processing solution to be performed when a certain processing time elapses without the silicon concentration measuring unit 12. The filter F2 is provided to remove, e.g., by-products generated in the processing vessel 21 or the like. Furthermore, although a gas exhaust pipe and/or a vent valve for exhausting a gas from the inside of the mixing tub 11 are provided in the mixing tub 11, as in the processing vessel 21, their illustration is omitted herein.

The semiconductor manufacturing apparatus 1 has the controller 2A implemented in, e.g., a computer, and the controller 2A includes a data processing unit having a program, a memory, and a CPU. The program contains commands for sending control signals to respective components of the semiconductor manufacturing apparatus 1 from the controller 2A and executing each processing step to be described later to thereby carry out the processing or the transfer of the wafer W.

Further, for example, the memory has a region in which processing parameters such as a processing pressure, a processing temperature, a processing time, a gas flow rate and the like are stored. When the CPU executes each command of the program, these processing parameters are read out and control signals in accordance with the parameters are sent to respective components of the semiconductor manufacturing apparatus 1.

The program (including a program related to an input manipulation or a display of the processing parameters) is installed in the controller 2A after being stored in a storage unit 2B implemented in a computer-readable storage medium such as a flexible disk, a compact disk, an MO (Magneto-Optical disk), a hard disk or the like.

Figure 4:
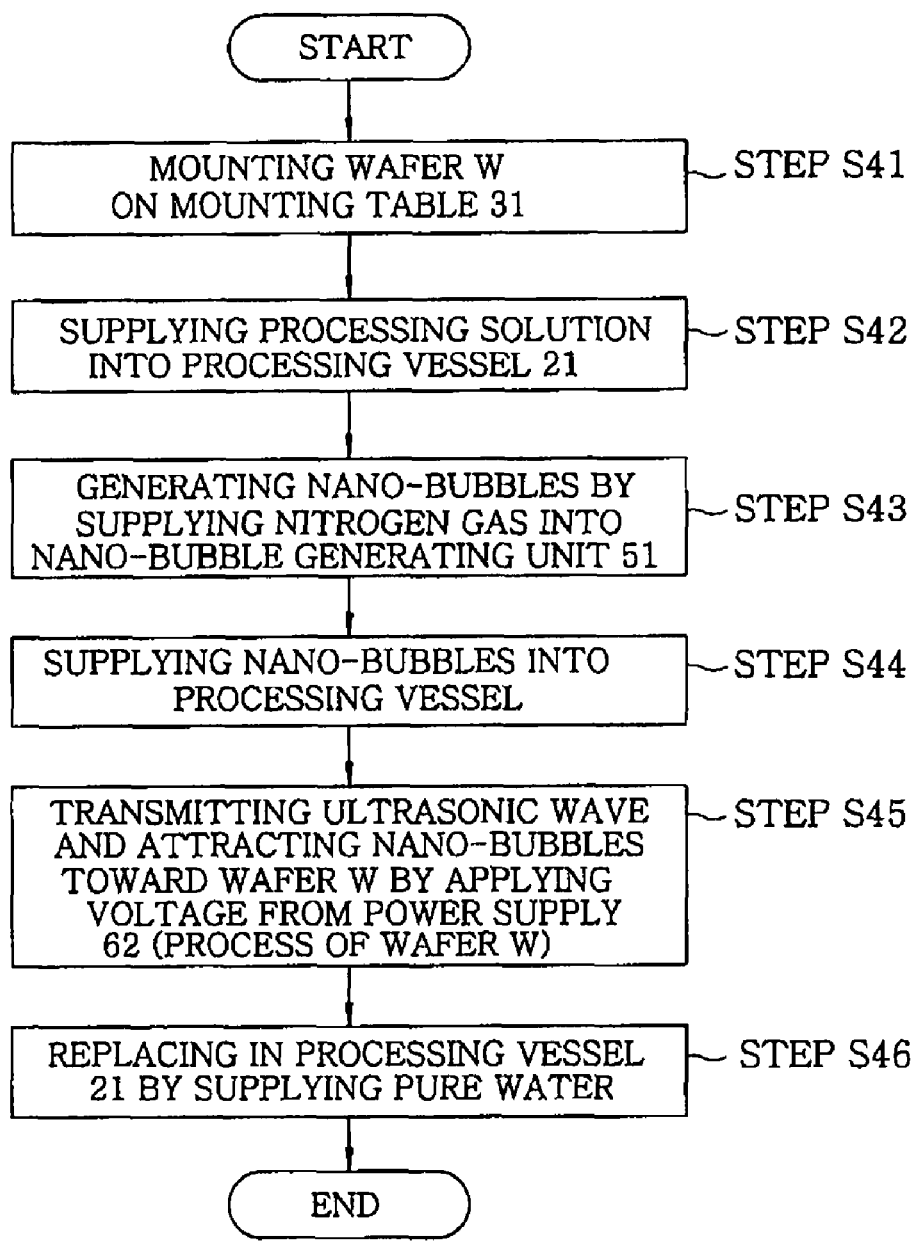
FIG. 4 is a flowchart of an example of a process for performing a semiconductor device manufacturing method in accordance with the present invention.
Figure 5A:
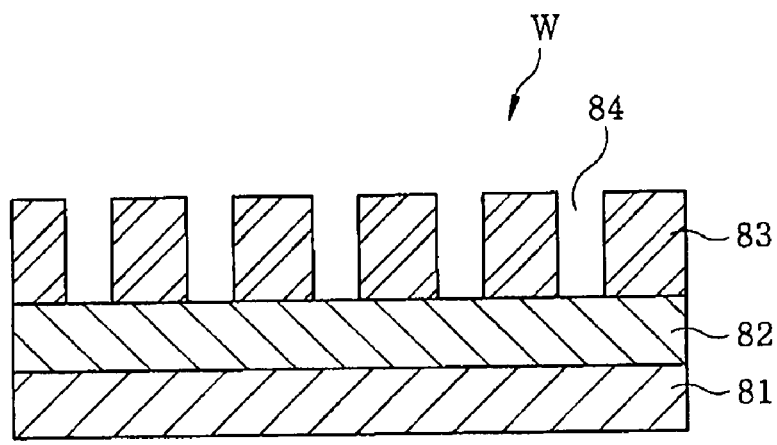
FIGS. 5A and 5B are longitudinal cross sectional views showing an example of a substrate to which the manufacturing method is applied.

Now, an operation of the first embodiment of the present invention will be described with reference to FIG. 4. Here, a configuration of the wafer W will be explained. As shown in FIG. 5A, the wafer W includes a silicon layer 81 and a silicon oxide layer 82 formed in this sequence from the bottom, and a resist mask 83 having a preset pattern such as a circular opening portion (opening) 84 of a size of 0.5 µm or the like is formed on the surface of the silicon oxide layer 82. Each processing step to be described below is a process for etching the silicon oxide layer 82 by using the resist mask 83.

(Step S41: Loading the Wafer W)

First, as shown in FIG. 6A, the mounting table 31 is set in the transfer position in advance by the elevating mechanism 63b. After a non-illustrated shutter is opened, the wafer W provided with the above-described pattern is loaded from the transfer port 22a by a transfer mechanism 116. Then, the wafer W is transferred onto the mounting table 31 from the transfer mechanism 116 by the elevation of the pins 65 and attracted and held in place by the suction of the suction path 32, as shown in FIG. 6B. Thereafter, as the mounting table 31 is moved upward, as illustrated in FIG. 6C, the ring-shaped insulator 25 of the upper member 23 and the peripheral portion of the mounting table 31 are brought into firm contact with each other, so that the processing region 26 is airtightly sealed.

(Step S42: Supplying the Processing Solution)

In the mixing tub 11, an aqueous solution of hydrogen fluoride and pure water are previously supplied from the hydrogen fluoride aqueous solution source 15a and the pure water source 15b and mixed with each other such that a volume ratio between hydrogen fluoride and pure water becomes a preset value, e.g., 1:200. Then, after a gas in the processing solution is removed by the deaerator 72, the processing solution is heated up to a preset temperature, e.g., 25° C. by the heater 73. Then, after setting the pressure of the pressurizing pump P to a preset value, e.g., 90 kPa (675 Torr), the processing region 26 is filled up with the processing solution by supplying the processing solution into the processing vessel 21 through the processing solution supply line 28 via the nano-bubble generating unit 51 and the filter F1 at a flow rate of 20 l/m, and the processing solution that has overflowed from the processing region 26 is returned back into the mixing tub 11 through the return line 71, thus maintaining the flow of the processing solution inside the processing region 26 in a steady state. Further, the temperature control unit 34 is controlled so as to allow the temperature of the wafer W to reach a preset temperature, e.g., 25° C.

In this process, since the surface of the wafer W comes into contact with the processing solution, the processing solution reaches the silicon oxide layer 82 via the opening portion 84 of the resist mask 83, whereby the silicon oxide layer 82 is slightly etched. Since, however, the opening size of the opening portion 84 is as small as 0.5 µm as stated above, it is difficult for the processing solution to be circulated through the inside of the opening portion 84. Accordingly, the silicon concentration of the processing solution in the vicinity of the silicon oxide layer 82 increases, whereas an etching rate falls greatly. As a result, the silicon oxide layer 82 is hardly etched in this process.

(Step S43: Generating Nano-Bubbles)

Thereafter, a nitrogen gas is supplied from the nitrogen gas source 57 into the nano-bubble generating unit 51 at a flow rate of 5 to 20 l/m. Inside the nano-bubble generating unit 51, the processing solution is made to flow toward one end of the housing 52 while revolving fast along the inner surface of the housing 52 after it flows first toward the opposite end (toward the nitrogen gas supply line 53) of the housing 52. As a result, like an aspirator, a negative pressure of, e.g., 0.06 MPa (450 Torr) is developed, whereby the nitrogen gas supplied from the nitrogen gas supply line 53 is suctioned. The nitrogen gas flows toward the one end of the housing 52 through a center portion of a vortex flow of the processing solution.

Figure 3B:
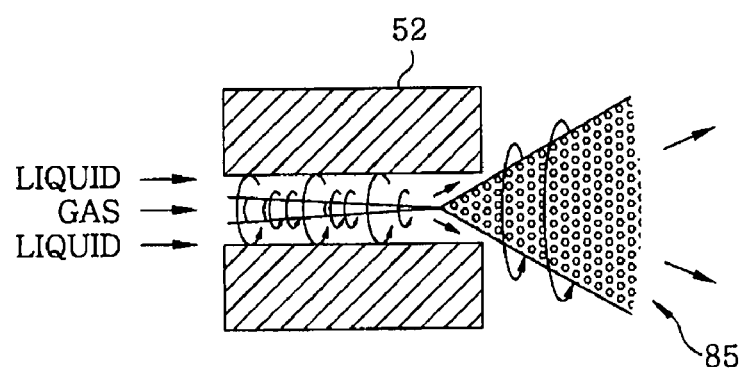

Since the revolving radius of the vortex flow of the processing solution gradually decreases as it approaches the one end of the housing 52, the processing solution and the nitrogen gas are mixed with each other at a point in the one end side of the housing 52, as shown in FIG. 3B, so that nano-bubbles 85 having a diameter ranging from hundreds of nanometers to tens of micrometers are generated. The nano-bubbles 85 are given negative charges of, e.g., 40 to 100 mV as a result of their friction with the processing solution (see, for example, Hirofumi OHNARI, Yui TUNAMI, Shrinking process and Shrinking pattern of micro-bubbles, $1^{st}$ micro nano bubble technology symposium).

(Step S44: Supplying the Nano-Bubbles 85 into the Processing Vessel 21)

Thereafter, the generated nano-bubbles 85 are supplied into the processing vessel 21 after nano-bubbles 85 equal to or larger than, e.g., size of 1 µm are removed by the filter F1. Further, if the concentration of the nitrogen gas measured by the gas concentration measuring unit 58 provided in the downstream of the filter F1 does not fall within a preset range, the processing of the wafer W is stopped by, for example, the controller 2A to be described later, as stated above.

(Step S45: Processing the Wafer W)

Figure 7:
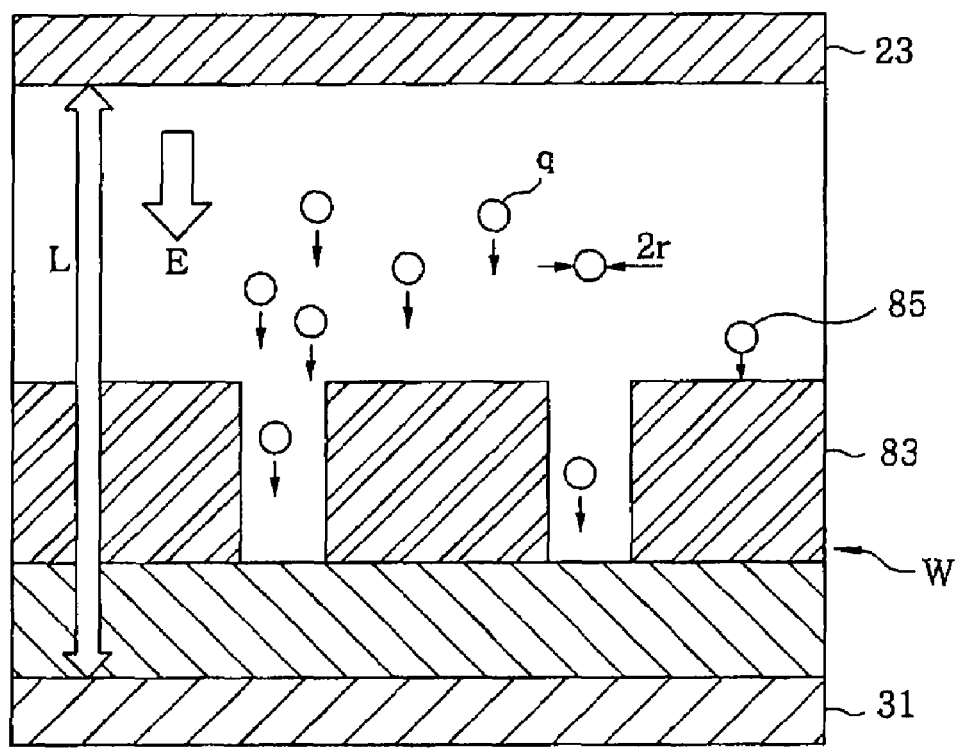
FIG. 7 is a longitudinal cross sectional view of the processing vessel, for schematically illustrating nano-bubbles in the processing vessel.

Next, a positive DC voltage set to a preset value, e.g., 10 V, is applied to the electrode 35 within the mounting table 31 from the power supply 62. Further, an ultrasonic wave of, e.g., 100 kHz is generated from the ultrasonic vibrator 42, thus vibrating the processing solution. As stated above, since the nano-bubbles 85 are negatively charged, they are vertically attracted toward the wafer W by the application of the positive voltage, as shown in FIG. 7. Furthermore, since the sizes of the nano-bubbles 85 are smaller than the opening size of the opening portion 84, they are even allowed to enter the inside of the opening portion 84. Since a tiny flow of processing solution is also generated due to the flow of the nano-bubbles 85, the processing solution is also introduced into the opening portion 84 along with the nano-bubbles 85. Here, the result of investigating conditions for facilitating this phenomenon is provided below.

As illustrated in FIG. 7, when the magnitude of the electric charge of the nano-bubble 85 is q[C]; the radius of the nano-bubble 85 is r[m]; the distance between the surface of the mounting table 31 and the bottom surface of the upper member 23 forming the processing region 26 is L[M]; the DC voltage applied from the power supply 62 to the electrode 35 is V[V]; and the intensity of the electric field formed inside the processing region 26 is E[V/m], the force F(N) by which the nano-bubbles 85 are attracted toward the wafer W is expressed by an equation as follows.

[Equation 1]

$$F = qE \quad (1)$$

Here, E is expressed by an equation as follows.

[Equation 2]

$$E = \frac{V}{L} \quad (2)$$

Further, a drag $F_D$[N] applied to the nano-bubble 85 from the processing solution is expressed by an equation as follows.

[Equation 3]

$$F_D = \frac{1}{2} C_D \rho U^2 \cdot \pi r^2 \quad (3)$$

Here, $C_D$, $\rho$, and U denote a drag coefficient, a density [kg/m$^3$] and a flow velocity [m/s], respectively. Further, to attract the nano-bubbles 85 toward the wafer W by the electric field in the processing region 26, the following expression needs to be satisfied.

[Equation 4]

$$F > F_D \quad (4)$$

Accordingly, from the equations (1) to (3), the voltage applied to the electrode 35 needs to be set as follows.

[Equation 5]

$$V > \frac{\pi r^2 L U^2 C_D \rho}{q} \quad (5)$$

Further, $C_D$ differs depending on the flow state of the processing solution within the processing region 26, and its value is varied for each of the following conditions depending on a Reynolds number (expressed by $Re_\rho$).

(Condition 1)

$$Re_p < 2 \quad (6)$$
$$C_D = \frac{24}{Re_p}$$

(Condition 2)

$$2 < Re_p < 500 \quad (7)$$
$$C_D = \frac{24}{\sqrt{Re_p}}$$

(Condition 3)

$$500 < Re_p \quad (8)$$
$$C_D = 0.44$$

Further, in this calculation, a buoyancy or a gravity applied to the nano-bubble 85 is deemed to be insubstantial and is negligible. In FIG. 7, illustration of the ultrasonic vibrator 42, the structure of the wafer W, and so forth is omitted.

A reaction at a bottom portion of the opening portion 84 at this time is schematically illustrated in FIGS. 8A to 8F. As stated above, since the nano-bubble 85 is vertically attracted onto the wafer W, the processing solution is also vertically attracted into the opening portion on the wafer W along with the nano-bubble 85, as shown in FIG. 8A. As illustrated in FIG. 8B, since the nano-bubbles 85 gradually shrink with the lapse of time, their internal pressures or temperatures increase with the progress of the shrinkage.

Then, if the nano-bubbles 85 reach the wafer W, the silicon oxide layer 82 is slightly etched by hydrogen fluoride that has arrived at the wafer W together with the nano-bubbles 85, as shown in FIG. 8C. At this time, the nano-bubbles 85 may be crushed to be split into nano-bubbles 85 having smaller diameters due to the contact (collision) between the nano-bubble 85 and the wafer W, as shown in FIG. 8D while each nano-bubble loses the negative charge by the contact. At this time, a part of the internal high-temperature and high pressure energy may be released. Owing to such locally generated high energy, the reactivity of the aqueous solution of hydrogen fluoride in the vicinity of the wafer W, for example, will be enhanced, so that the etching of the silicon oxide layer 82 by the hydrogen fluoride will be facilitated considerably.

Further, since the ultrasonic vibration is applied to the processing solution, as stated above, the frequency of the occurrence of the crush of the nano-bubbles 85 at the time of their collision with the wafer W increases, so that a rapid progress of etching can be realized.

Since new nano-bubbles 85 having negative charges are continuously attracted onto the wafer W, the nano-bubbles 85 which have lost negative charges due to the contact with the wafer W are pushed out by the nano-bubbles 85 newly attracted onto the wafer W, as illustrated in FIG. 8E, and are extruded out of the opening portion on the wafer W along with the processing solution in which the silicon oxide layer 82 is dissolved. Thereafter, the extruded nano-bubbles 85 disappear (or dissolved), as shown in FIG. 8F.

As described above, since the nano-bubbles 85 having the negative charges are attracted onto the wafer W and afterward they lose the negative charges due to the collisions with the wafer W, a circulation flow of the nano-bubbles 85 and the processing solution is generated in a perpendicular direction to the wafer W. Accordingly, a new processing solution can be supplied onto the bottom surface of the narrow opening portion 84 while the silicon oxide or the like dissolved in the processing solution is discharged out into the region above the wafer W, so that the etching of the silicon oxide layer 82 can be performed with high anisotropy.

Moreover, since the circulation velocity of the nano-bubbles 85 (processing solution) increases in proportion to the voltage applied to the electrode 35, as clearly can be seen from the above-descried equations (1) and (2), an etching rate can be controlled by means of controlling the voltage.

Furthermore, although the crushes of the nano-bubbles 85 has been only described to be caused due to their collisions with the wafer W, such crushes can also occur naturally with the lapse of time after the nano-bubbles 85 are generated. In such natural case, since no influence upon the processing of the wafer W is exerted, description of such case is omitted here.

By maintaining this state for a preset period of time, e.g., 240 seconds, the above-stated reaction occurs repeatedly, so that the silicon oxide layer 82 at the bottom portion of the opening portion 84 is vertically etched by a preset depth, e.g., 300 nm.

(Step S46: Stopping the Etching Process)

When the preset etching process is completed, the application of the voltage from the power supply 62 and the ultrasonic oscillations by the ultrasonic vibrators 42 are stopped, and the supply of the nitrogen gas from the nitrogen gas source 57 is stopped as well. Further, the supply of the processing solution from the hydrogen fluoride aqueous solution source 15a is also stopped. Then, pure wafer is supplied into the processing region 26 from the cleaning solution supply unit 44, until the aqueous solution of hydrogen fluoride in the processing region 26 is replaced with the pure water sufficiently. Thereafter, the supply of the pure water is stopped, and the whole amount of the pure water in the processing region 26 is discharged under the control of the mass flow controller 71a. At this time, in case that the pure water W remains on the wafer W, a nitrogen gas is ejected to the wafer W from the gas supply source 41 so that the pure water on the wafer W may be removed. This nitrogen gas is exhausted out through the above-described gas exhaust pipe 39. Thereafter, the wafer W is unloaded from the processing vessel 21 in the reverse sequence as described.

As stated above, the processing solution discharged from the processing region 26 via the return line 71 is mixed with the new processing solution in the mixing tub 11 to be circulated. Further, though the nano-bubbles 85 in the processing solution returned back into the mixing tub 11 naturally crush with the lapse of time and the nitrogen gas inside is dissolved in the processing solution, the nitrogen gas is removed as it passes through the deaerator 72. Further, it may be also possible to provide an additional waste pipe (not shown) in the return line 71 for discharging the pure water used in the cleaning of the wafer W instead of returning the used pure water into the mixing tub 11.

In accordance with the present embodiment, the nano-bubbles 85 smaller than the opening size of the opening portion 84 of the resist mask 83 and having negative charges are dispersed into the processing solution, and the nano-bubbles 85 are attracted onto the wafer W by forming the electric field in the processing solution. Thus, etching can be rapidly performed even in a narrow region (inside the opening portion 84 of the resist mask 83) where etching may be difficult to carry out or takes a long time with a typical wet method because it is difficult to circulate the processing solution in such narrow region. Even with such wet method, it is possible to perform the etching of the wafer W with high anisotropy as in a dry method (dry etching or the like). At that time, since energy deemed to be generated when the nano-bubbles 85 are crushed due to their collisions (contact) with the wafer W is used in the etching, the etching rate can be increased, and since the frequency of occurrences of the crushes of the nano-bubbles 85 at the time of the collisions between the wafer W and the nano-bubbles 85 is increased by applying the ultrasonic vibration to the processing solution, the etching rate can be further increased.

Since these nano-bubbles 85 have the negative charges, they are uniformly dispersed in the processing solution without cohering with each other, the above-stated crushes of the nano-bubbles due to their contact with the wafer W occur uniformly across the entire surface of the wafer W, so that the etching process can be allowed to progress in a uniform manner.

Furthermore, since the etching process is carried out by the processing solution, the process can be uniformly performed over the entire region of the wafer W, and overheating up to a temperature causing a damage of a device or a charging damage by the plasma or the like can be prevented. That is, the present etching method can take advantages (high anisotropy and processability in a narrow region) of a dry method as well as advantages (high etching rate, in-plane etching uniformity, low load on a device, low-cost apparatus, and low energy consumption) of a wet method.

Further, since the particle diameters of the nano-bubbles 85 are adjusted by the filter F1, the particle diameters of the nano-bubbles 85 can be selected based on the opening size of the opening portion 84 of the resist mask 83. For example, in case that the opening size is large, the nano-bubbles 85 may be directly supplied without providing the filter F1, thus increasing the supply amount of the nano-bubbles 85. In case that the opening size is small, however, the filter F1 may be selected in such a manner as to further reduce the particle diameter of the nano-bubbles 85, thus allowing high-accuracy etching to be carried out.

The processing vessel 21 for performing such etching process needs to be sealed air-tightly just enough to prevent a leakage of the processing solution, and high air-tightness capable of enduring a high vacuum, which is necessary for a typical plasma process, is not required. Thus, the apparatus can be manufactured at a low cost, and peripheral equipment such as a vacuum pump and the like becomes unnecessary.

Though the nitrogen gas is used as the processing gas in the first embodiment described above, an argon gas, an oxygen gas, the atmosphere, or the like can also be used as the processing gas. Alternatively, a gas containing carbon and fluorine used in a typical plasma etching process may be used as the processing gas. An example of such case will be explained below.

(Second Embodiment: Etching by a Processing Solution and a Processing Gas)

Figure 9:
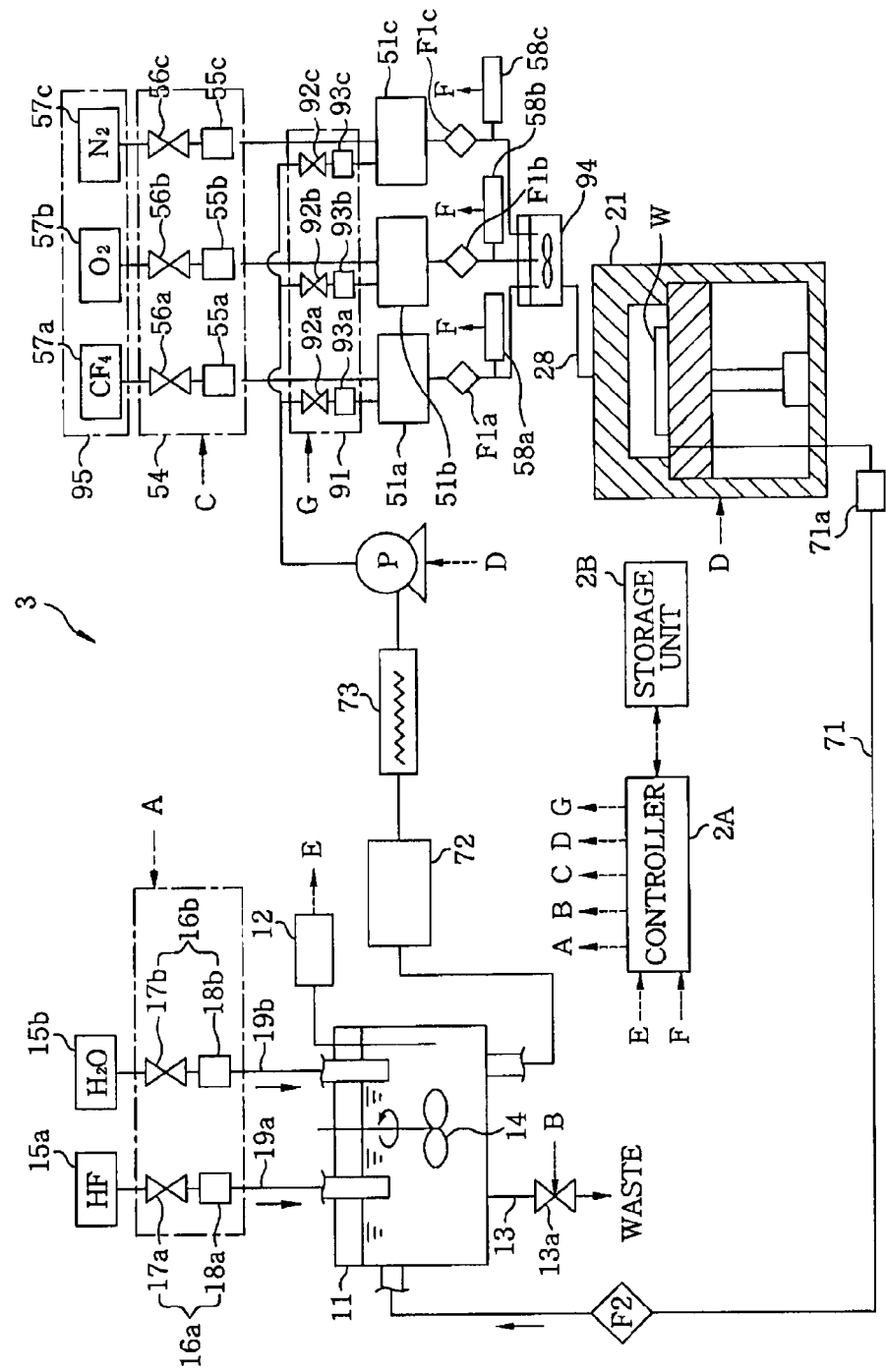
FIG. 9 is a configuration view showing another example of the semiconductor manufacturing apparatus in accordance with the present invention.

FIG. 9 illustrates an example of a semiconductor manufacturing apparatus 3 for performing a second embodiment of the semiconductor device manufacturing method in accordance with the present invention. The semiconductor manufacturing apparatus 3 has the substantially same configuration as that of the semiconductor manufacturing apparatus 1 excepting that a gas containing carbon and fluorine, e.g., a $CH_4$ gas, an oxygen gas and a nitrogen gas, are used as a gas for forming nano-bubbles 85.

To elaborate, as shown in FIG. 9, a processing solution supply line 28 branches off into three lines in the downstream of a pressurizing pump P as stated above, and three branch lines are connected with nano-bubble generating units 51a, 51b and 51c via valves 92a, 92b and 92c and mass flow controllers 93a, 93b and 93c, respectively. The nano-bubble generating units 51a, 51b and 51c are connected with a CF-based gas source 57a which stores therein a gas containing carbon and fluorine, e.g., a $CF_4$ gas, an oxygen gas source 57b and a nitrogen gas source 57c via mass flow controllers 55a, 55b and 55c and valves 56a, 56b and 56c, respectively. Downstream sides of the nano-bubble generating units 51a, 51b and 51c are connected with a mixing vessel 94 via filters F1a, F1b and F1c and gas concentration measuring units 58a, 58b and 58c, respectively. A processing vessel 21 as stated above is connected with the mixing vessel 94 via the processing solution supply line 28.

In the present embodiment, the nitrogen gas is used to dilute the $CF_4$ gas and the oxygen gas, and it may be replaced with another inert gas, e.g., an argon gas or the like.

Further, the valves 92a, 92b and 92c and the mass flow controllers 93a, 93b and 93c are included in a processing solution flow rate control unit 91, and the mass flow controllers 55a, 55b and 55c and the valves 56a, 56b and 56c are included in a gas supply control unit 54. In addition, the gases supplied from the CF-based gas source 57a, the oxygen gas source 57b and the nitrogen gas source 57c are used as a processing gas, and the respective gas sources 57a, 57b and 57c are included in a processing gas source 95.

Now, an operation of the second embodiment will be explained. Since each step in the second embodiment is the same as that described in the first embodiment, the process will be explained with reference to the flowchart shown in FIG. 4. Further, redundant description of the process will be omitted.

(Step S42: Supplying a Processing Solution)

A processing solution stored in a mixing tub 11 is supplied into the nano-bubble generating units 51a, 51b and 51c via the pressurizing pump P set to a preset pressure, e.g., 90 kPa (675 Torr) and the processing solution flow rate control unit 91. At this time, the processing solution flow rate control unit 91 is controlled such that the flow rates of the processing solution supplied into the nano-bubble generating units 51a, 51b and 51c become 20, 20 and 5 l/m, respectively.

After mixed in the mixing vessel 94, the processing solution is supplied into the processing vessel 21 and maintained therein until the flow of the processing solution comes into a steady state in the processing region 26. In such case, the wafer W is slightly etched.

(Step S43: Generating Nano-Bubbles)

The $CF_4$ gas, the oxygen gas and the nitrogen gas are supplied from the processing gas source 95 into the nano-bubble generating units 51a, 51b and 51c such that their flow rates become 1, 1 and 5 l/m, respectively controlled, by means of the gas supply control unit 54. In the nano-bubble generating units 51a, 51b and 51c, the processing solution and each gas are mixed, so that nano-bubbles 85 are generated.

(Step S44: Supplying the Nano-Bubbles 85 into the Processing Vessel 21)

Then, nano-bubbles 85 having large diameters are removed by the respective filters F1a, F1b and F1c, and after measuring the concentration of each gas (amount of the nano-bubbles 85) by each of the measuring units 58a, 58b and 58c, the processing solution in which the nano-bubbles 85 made of the processing gas are dispersed is supplied into the processing vessel 21.

(Step S45: Processing the Wafer W)

Then, as in the above-described first embodiment, an etching process is performed on a wafer W. In the present embodiment, the nano-bubbles 85 are attracted onto the wafer W, and as the processing solution also flows vertically toward the wafer W along with the nano-bubbles 85, etching by the processing solution is carried out. Further, since the $CF_4$ gas as an etching gas is contained in the nano-bubbles 85 as the processing gas, etching is also carried out by this processing gas. The etching state of the wafer W by this processing gas is schematically illustrated in FIGS. 10A to 10F. Further, since etching by the processing solution is identical with that described in the first embodiment in FIGS. 8A to 8F, illustration of the etching by the processing solution is omitted for the sake of simplicity.

Figure 10C:
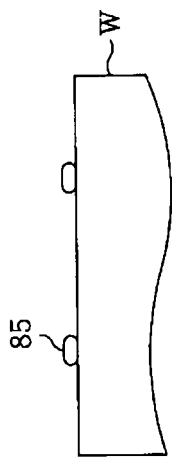
FIGS. 10A to 10F are schematic diagrams showing an example of a state of a substrate being etched by a processing gas in nano-bubbles in the manufacturing method in accordance with the present invention.
Figure 10B:
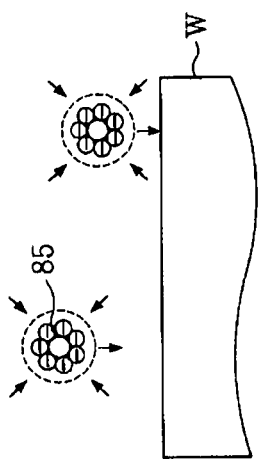
Figure 10A:
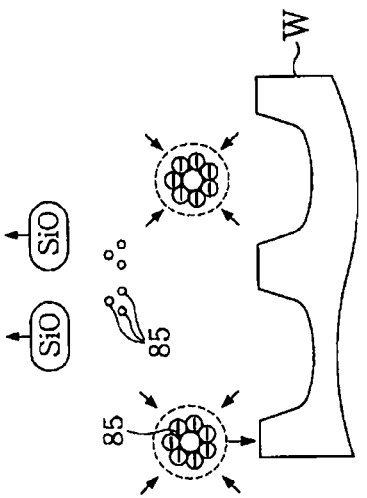
Figure 10F:
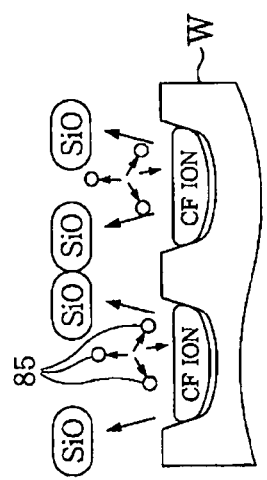
Figure 10E:
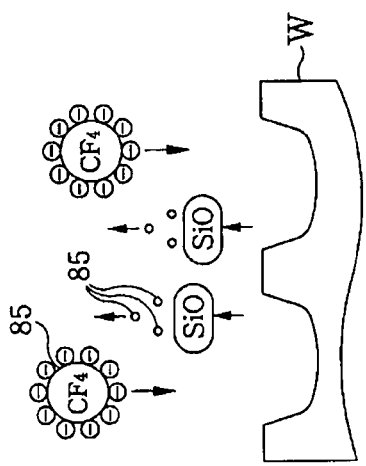
Figure 10D:
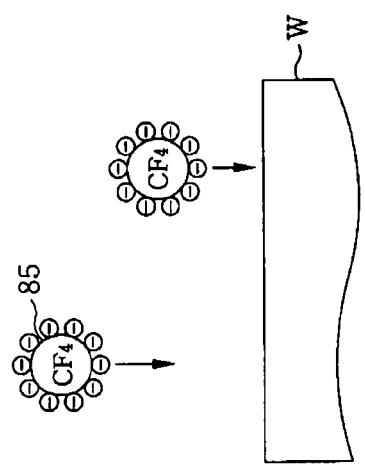

As illustrated in FIGS. 10A and 10B, as the nano-bubbles 85 are attracted toward the wafer W, they shrink, so that their internal temperatures and pressures increase. Then, by the collisions with the wafer W in FIG. 10C, the nano-bubbles 85 lose negative charges, and the nano-bubbles 85 crush, so that they are split into nano-bubbles 85 having smaller diameters, as illustrated in FIG. 10D.

The processing gas inside the nano-bubbles 85 is decomposed by an energy released at that time, so that active species such as CF ions, oxygen ions, and the like are generated. A silicon oxide layer 82 is etched by the active species and by-products are dissolved or diffused into the processing solution. The nano-bubbles 85 that have lost electric charges are pushed out by incoming nano-bubbles 85 continuously attracted toward the wafer W, as shown in FIG. 10E, and flowed up above the wafer W along with the by-products generated by the etching, and then finally disappear, as shown in FIG. 10F.

In the second embodiment, since ultrasonic vibration is applied to the processing solution from ultrasonic vibrators 42, as in the first embodiment, the amount of nano-bubbles 85 crushed when they collide with the wafer W increases, whereby etching progresses more quickly. By maintaining this state for a preset time period, e.g., 300 seconds, the silicon oxide layer 82 at the bottom portion of the opening portion 84 is etched by a preset depth, e.g., 300 nm.

(Step S46: Stopping the Etching Process)

Then, as in the above-described first embodiment, etching is stopped. In this process, the processing gas dissolved in the processing solution is returned back into the mixing tub 11 through a return line 71 and is removed by a deaerator 72, as in the case of the nitrogen gas described above.

In accordance with the above-stated second embodiment, the following effect is obtained in addition to those obtained in the first embodiment. Since the nano-bubbles 85 are generated by the processing gas for generating the active species capable of etching the silicon oxide layer 82, active species of the processing gas are further generated by the energy generated when the nano-bubbles 85 collide with the silicon oxide layer 82. Since the silicon oxide layer 82 is etched by these active species as well, the etching can be performed more quickly than in case of the etching by the processing solution in the first embodiment.

In the second embodiment, though the silicon oxide layer 82 is etched by the processing gas and the processing solution as described above, it may be possible to perform the etching by the aqueous solution of hydrogen fluoride without using the etching gas such as the CF gas, as in the first embodiment, or it may be also possible to perform the etching by using the CF gas as the processing gas without using the aqueous solution of hydrogen fluoride or the like. Such examples will be explained below.

(Third Embodiment: Etching by a Processing Gas)

Figure 11:
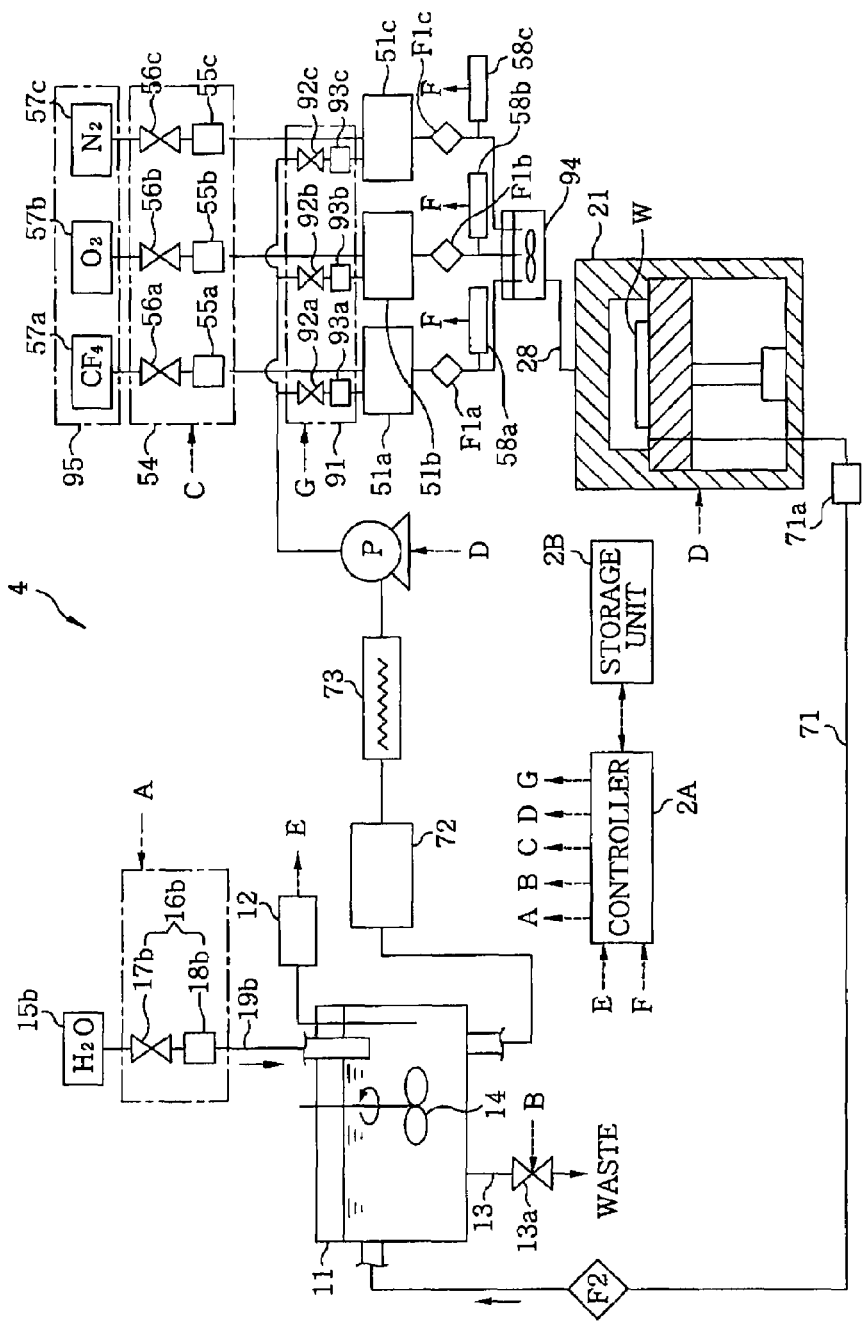
FIG. 11 is a configuration view showing still another example of the semiconductor manufacturing apparatus in accordance with the present invention.

FIG. 11 illustrates a semiconductor manufacturing apparatus 4 for performing a third embodiment of the semiconductor device manufacturing method in accordance with the present invention. This semiconductor manufacturing apparatus has the substantially same configuration as that of the semiconductor manufacturing apparatus 3 in the first embodiment excepting that it has a pure water source 15b to supply pure water as a processing solution instead of hydrogen fluoride.

In the third embodiment, each step is performed as in the second embodiment described above, and etching is performed through the reaction mechanism illustrated in FIGS. 10A to 10F. Further, in the present embodiment, a heater 73 and a temperature control unit 34 are set to, e.g., 130° C. to accelerate the etching. Further, in a step S46, etching is performed for 300 seconds.

In the present embodiment, etching with high anisotropy can be performed even in a narrow region.

As described in the above embodiments, when performing an etching process by using the processing solution in which the nano-bubbles 85 are dispersed, an etching process having advantages of both a wet process and a dry process can be performed by allowing at least one of the processing solution and the processing gas to contain components contributing to the etching (components which generate a substance serving as active species in the etching process).

(Fourth Embodiment: Film Formation by a Processing Solution)

Figure 5B:
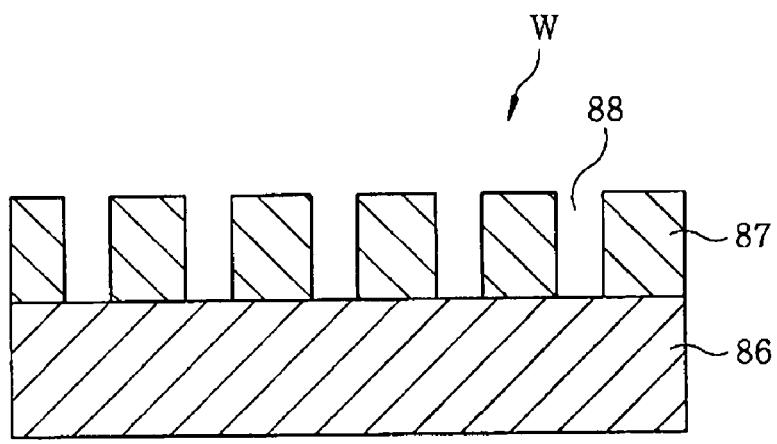

Now, there will be explained an embodiment in which the present invention is applied to a film forming process. FIG. 5B shows an example of a wafer W as a target object used in the film forming process. The wafer W has an insulating film 87 provided with an opening portion 88 as a pattern formed of a hole or a groove. The opening size of the opening portion 88, e.g., the diameter of a hole or the width of a groove, is set to be 10 nm to 5000 nm. Further, an underlayer 86 is formed under the insulating film 87. A method for filling the opening portion 88 with a metal film, e.g., a copper film will be described hereinafter.

Figure 12:
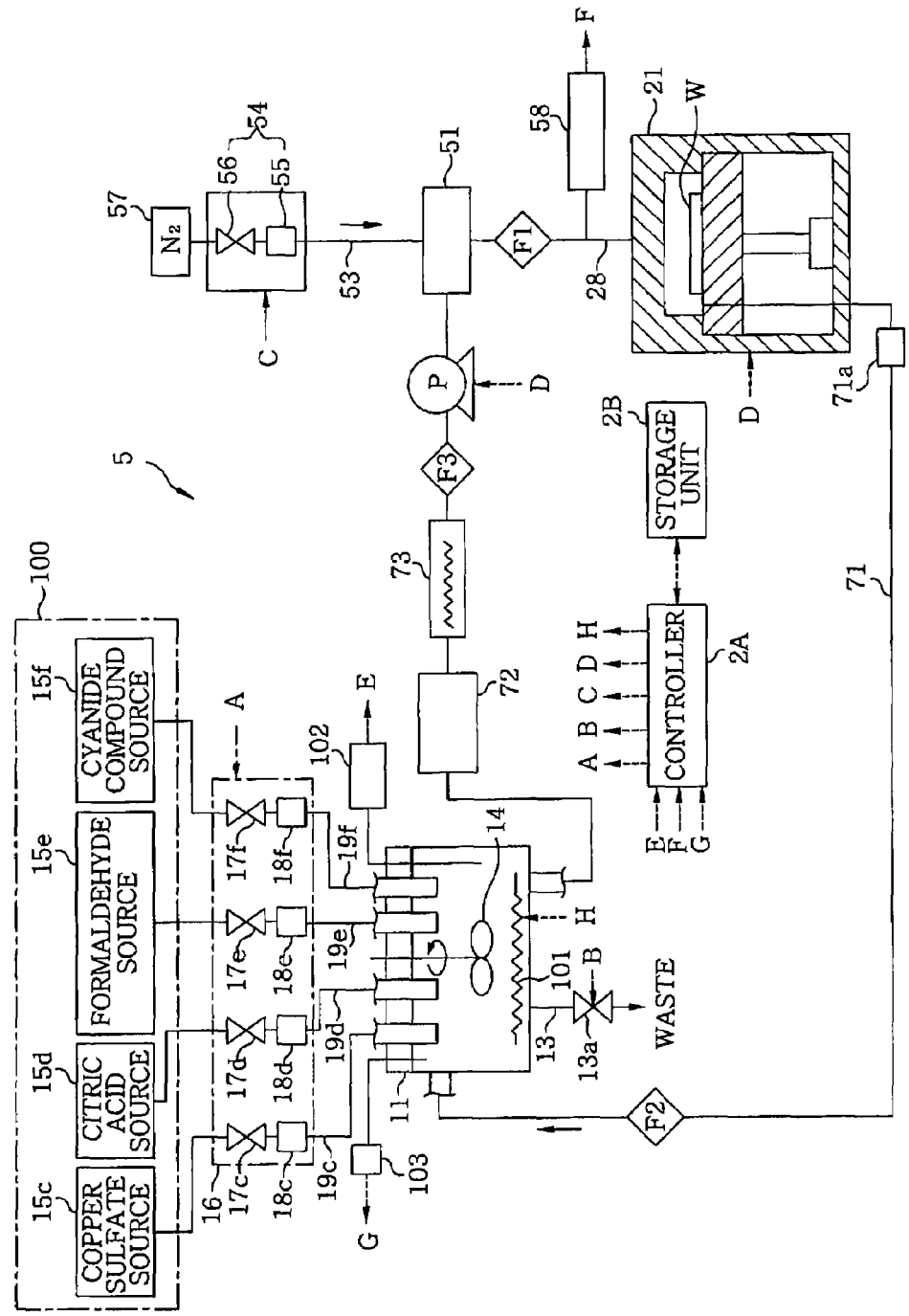
FIG. 12 is a configuration view showing still another example of the semiconductor manufacturing apparatus in accordance with the present invention.

FIG. 12 shows an example of a semiconductor manufacturing apparatus 5 for performing a fourth embodiment of the semiconductor device manufacturing method in accordance with the present invention. The semiconductor manufacturing apparatus 5 has the substantially same configuration as that of the semiconductor manufacturing apparatus 1 in the above-described first embodiment excepting that a mixed solution containing, for example, a metal salt such as copper sulfate ($CuSO_4$), a complexing agent such as citric acid, a reducing agent such as formaldehyde and a stabilizer such as cyanide compound is used as a processing solution.

Specifically, as shown in FIG. 12, a copper sulfate source 15*c*, a citric acid source 15*d*, a formaldehyde source 15*e* and a cyanide compound source 15*f* are connected to a mixing tub 11 by supply lines 19*c*, 19*d*, 19*e* and 19*f* via mass flow controllers 18*c*, 18*d*, 18*e* and 18*f* and valves 17*c*, 17*d*, 17*e* and 17*f*, respectively. Though the copper sulfate source 15*c*, the citric acid source 15*d*, the formaldehyde source 15*e* and the cyanide compound source 15*f* are previously dissolved in pure water or the like and supplied in a solution state, it may be also possible to supply them in a powder state and then to dissolve them in the mixing tub 11.

Furthermore, though the above-specified compounds are used as the metal salt, the complexing agent, the reducing agent and the stabilizer in the present embodiment, it may be also possible to use, e.g., copper nitrate or copper chloride as the metal salt and to use, e.g., tartaric acid or gluconic acid as the complexing agent. Moreover, dimethylaminoborane, sodium hypophosphite, or the like can be used as the reducing agent, and neocuproine may be used as the stabilizer. That is, each compound may be selected so as to obtain a solution composition used for a typical electroless plating method, or other stabilizers or pH adjusters can be mixed. The copper sulfate source 15*c*, the citric acid source 15*d*, the formaldehyde source 15*e* and the cyanide compound source 15*f* are included in a processing solution source 100, and the mass flow controllers 18*c*, 18*d*, 18*e* and 18*f* and the valves 17*c*, 17*d*, 17*e* and 17*f* are included in a processing solution control unit 16.

Further, a temperature controller 101 such as a heater or the like, a concentration detector 102 for detecting a concentration of, for example, copper ions and a temperature detector 103 capable of detecting a pH and a temperature of the processing solution are provided inside the mixing tub 11. The temperature of the processing solution in the mixing tub 11 is controlled within a range from a room temperature to 60° C. Further, based on measurement results, preset source materials are added from the processing solution to regulate the concentration of the copper ions and the pH value of the processing solution within predetermined ranges. That is, when the concentration of the copper ions in the processing solution is reduced because the copper ions and the like are consumed by a film forming process to be described later, copper ions and the like are supplied from the processing solution source 100.

Further, it may be possible to calculate the concentration of the copper ions in the processing solution from the pH value detected by the temperature detector 103 without installing the concentration detector 102. The heater 73 is controlled such that the temperature of the processing solution falls within the range of, e.g., the room temperature to 60° C. Further, a filter F3 is provided between the heater 73 and the pressurizing pump P to remove, e.g., a compound precipitated in the processing solution.

Now, an operation of the present embodiment will be explained. Since each step in the present embodiment is the same as that described in the first embodiment, the explanation will be provided with reference to FIG. 4 again, and description of the same process as that described in the first embodiment will be omitted.

(Step S42: Supplying the Processing Solution)

The processing solution control unit 16 is controlled such that the copper sulfate, the citric acid, the formic aldehyde and the cyanide compound are supplied from the processing solution source 100 into the mixing tub 11 at preset concentrations. Then, the processing solution in the mixing tub 11 is sufficiently mixed by an agitator 14 and the temperature controller 101 such that the temperature of the processing solution is in the range covering from, e.g., a room temperature to 60° C. Then, the processing solution is supplied into the processing vessel 21 through the processing solution supply line 28 at a flow rate of 20 l/m via the deaerator 72, the filter F3, the heater 73 set to the preset temperature ranging from, e.g., the room temperature to 60° C., the pressurizing pump P set to a preset pressure, e.g., 90 kPa, the nano-bubble generating unit 51 and the filter F1. Further, the temperature control unit 34 is adjusted such that the temperature of the wafer W ranges from, e.g., the room temperature to 60° C.

By this process, the surface of the wafer W is made to come into contact with the processing solution, as in the above-stated first embodiment, whereby a copper film is formed on the surface of the wafer W. However, since the opening size of an opening portion 88 is small, the copper film is hardly formed inside the opening portion 88.

(Step S43: Generating Nano-Bubbles)

As described, nano-bubbles 85 are generated by using a nitrogen gas.

(Step S45: Attracting Nano-Bubbles 85 and Applying Ultrasonic Vibration)

As in the above-described embodiments, a voltage is applied from a power supply 62 to an electrode 35, and ultrasonic vibration is applied to the processing solution by ultrasonic vibrators 42. As a result, the nano-bubbles 85 are attracted toward the wafer W and made to enter the inside of the opening portion 88. Further, the processing solution is also introduced into the opening portion 88 along with the nano-bubbles 85, so that a copper film is formed therein.

Figure 13A:
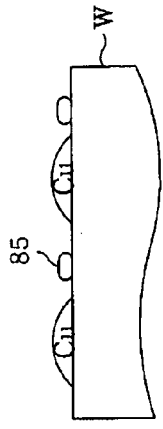
FIGS. 13A to 13F are schematic diagrams showing an example of a state of forming a copper film on the substrate by a processing solution in the manufacturing method in accordance with the present invention.
Figure 13B:
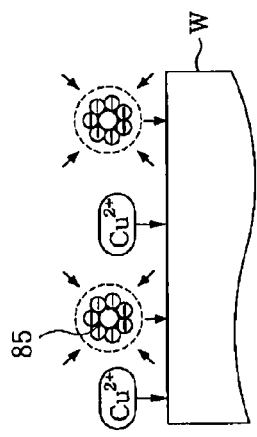
Figure 13C:
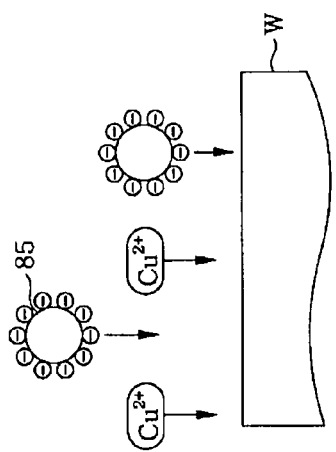
Figure 13D:
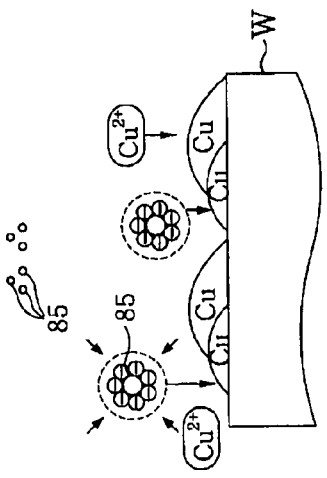
Figure 13E:
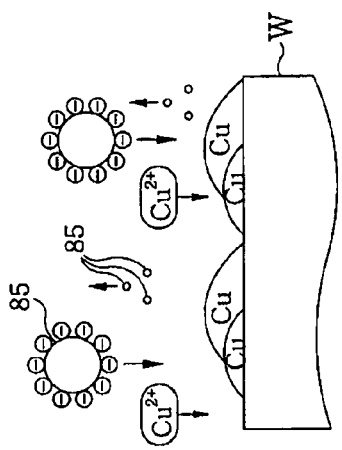
Figure 13F:
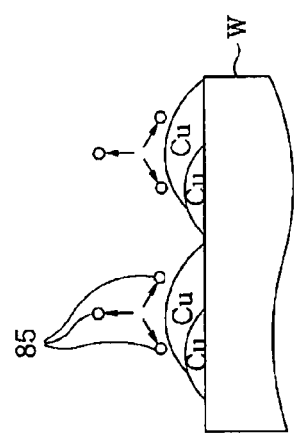

This reaction will be further explained with reference to FIGS. 13A to 13F. Though copper ions are stably dispersed in the processing solution as complexing agents or the like, they are simplified and shown as copper ions in FIGS. 13A to 13F. As illustrated in FIGS. 13A and 13B, a nano-bubble 85 is attracted toward the wafer W along with the copper ions, and the internal temperature and pressure of the nano-bubble 85 increases due to its shrinkage. Then, if the nano-bubble 85 collides with the wafer W, as shown in FIGS. 13C and 13D, electric charges are lost. Further, the copper ions that have come into contact with the wafer W are formed as metal copper film. When the nano-bubble 85 collides with the wafer W, the nano-bubble 85 is crushed, and the copper ions are reduced to the metal copper rapidly by the energy (heat) generated at that time, so that the copper film is formed thick. Thereafter, as shown in FIGS. 13E and 13F, the nano-bubble 85 that has lost negative charges rises along with the processing solution containing a smaller number of copper ions or a hydrogen gas generated by the precipitation of the metal copper, and then finally disappears.

By maintaining this state for a preset period of time, the opening portion 88 is filled up with the metal copper.

(Step S46: Stopping the Film Forming Process)

Then, as in the prior embodiments, the processing region 26 is replaced with pure water, and the film forming process is stopped. After the wafer W is unloaded, an unnecessary copper film formed on the surface of the wafer W (i.e., the surface of an insulating film 87) is removed by, for example, a CMP process.

The only difference between the fourth embodiment and the first embodiment is that the etching process on the wafer in the first embodiment is changed to the film forming process which forms a metal film on the wafer. The effect of both processes on the wafer W is the same.

Further, when the film forming process is performed in the processing solution having the same solution composition without using the nano-bubbles 85, the metal copper is hardly formed inside the opening portion 88 but is only formed on the surface of the wafer W. In such case, a hole is left in the opening portion 88 and it may become a cause of conduction error of a device. However, in the present embodiment, since the processing solution is attracted into the opening portion 88 along with the nano-bubbles 85, the film formation can be performed with high anisotropy. That is, since the metal copper is gradually precipitated from the bottom surface of the opening portion 88 while a growth of a copper film from the sidewall of the opening portion 88 is suppressed, the copper film can be densely formed at the inside of the opening portion 88 as well as on the surface of the wafer W, a copper film having less defect can be obtained.

Further, since the temperature of the processing solution is increased locally (at the bottom surface of the opening portion 88), waste of source material or decomposition of the processing solution can be suppressed, while an effect of improving a film forming rate can be achieved. That is, if the temperature of the processing solution is entirely increased, a film forming rate of the processing solution also increases entirely, so that the metal copper may be precipitated on a portion (inner wall of the processing vessel 21 or the like) in contact with the processing solution or in the processing solution. As a result, waste of source material or particle generation will be caused, and the frequency for cleaning the inside of the processing vessel 21 may be increased.

However, in the present embodiment, since the temperature of the processing solution is controlled within the range from room temperature to 60° C. and only the temperature of the processing solution in the portion (bottom surface of the opening portion 88) on which a film is to be formed is locally increased by the crush of the nano-bubbles 85, the waste of source material can be avoided and the time necessary for the cleaning of the inside of the processing vessel 21 can be reduced. Further, the copper film can be formed on the bottom surface of the opening portion 88 at a high film forming rate.

Furthermore, if the temperature of the processing solution is increased, the above-stated compounds dissolved in the processing solution will be decomposed, whereby the composition of the processing solution becomes instable, resulting in an adverse effect on the film forming rate or film qualities (surface roughness, density, purity, plasticity, and the like). In the present embodiment, however, since the temperature of the processing solution is locally increased, the likelihood of occurrence of such problems is relatively low.

Further, in the fourth embodiment, it may be possible to perform the film formation by using a processing gas, e.g., an organic gas containing copper, as well as the processing solution, or to perform the film formation by using a processing gas containing copper while using pure water as a processing solution, as in the first embodiment. Moreover, in the fourth embodiment, though the film formation of the copper film is performed by using the electroless plating method in which a metal is precipitated on the surface of a solid by a chemical reaction (reduction reaction), it is also possible to form the copper film by electroplating. In case of the electroplating, a conductive metal film, e.g., a tungsten film, having a thickness of, e.g., 20 nm is previously formed on the surface of the wafer W (i.e., on the surface of the insulating film 87 and the entire inner surface the opening portion 84) by, e.g., a sputtering method, and an electrode is connected to the tungsten.

As described in the above embodiment related to the film forming method, when performing the film forming process by using the processing solution in which the nano-bubbles 85 are dispersed, a film forming process having advantages of both a wet process and a dry process can be performed by allowing at least one of the processing solution and the processing gas to contain components contributing to the film formation (components which generate a substance serving as active species in the film forming process).

In each of the above-described embodiments, although the ultrasonic vibrators 42 are installed in the processing vessel 21, it may be also possible not to prepare the ultrasonic vibrators 42 because the crush of the nano-bubbles 85 occur naturally, as mentioned above. Further, although a DC voltage is applied to the electrode 35 from the power supply 62, an AC power can be applied instead. In such case, since the nano-bubbles 85 are moved such that they vibrate in a vertical direction with respect to the wafer W, the replacement of the processing solution in the opening portions 84 and 88 can be carried out rapidly. In addition, although pure water or a processing solution containing a solute dissolved in pure water is used as a liquid supplied into the processing region 26, alcohol having polarity, an organic solvent, or the like can be used instead as long as their solvents are not precipitated.

Figure 2:
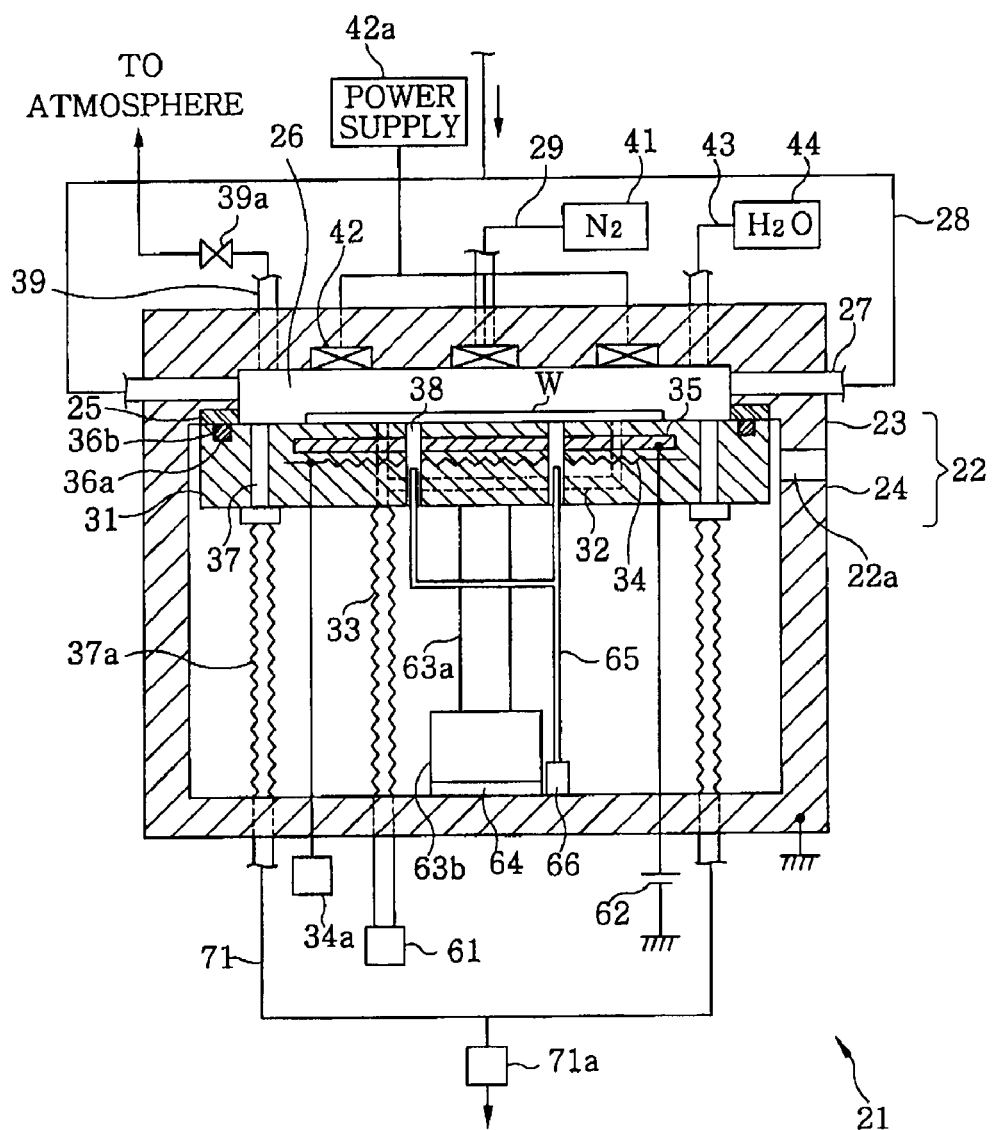
FIG. 2 is a longitudinal cross sectional view showing an example of a processing vessel of the manufacturing apparatus.

Although the processing vessel 21 shown in FIG. 2 is used to perform the etching process or the film forming process on the wafer W, a processing vessel having another configuration can also be used. As stated above, the nano-bubbles 85 are small, and it is deemed that they are hardly influenced by buoyancy or gravity. However, if the specific gravity of a processing solution containing, e.g., hydrogen fluorine or metal salt dissolved therein is great and it receives a buoyancy, it may be possible to use a processing vessel 111 to be described hereinafter.

Figure 14:
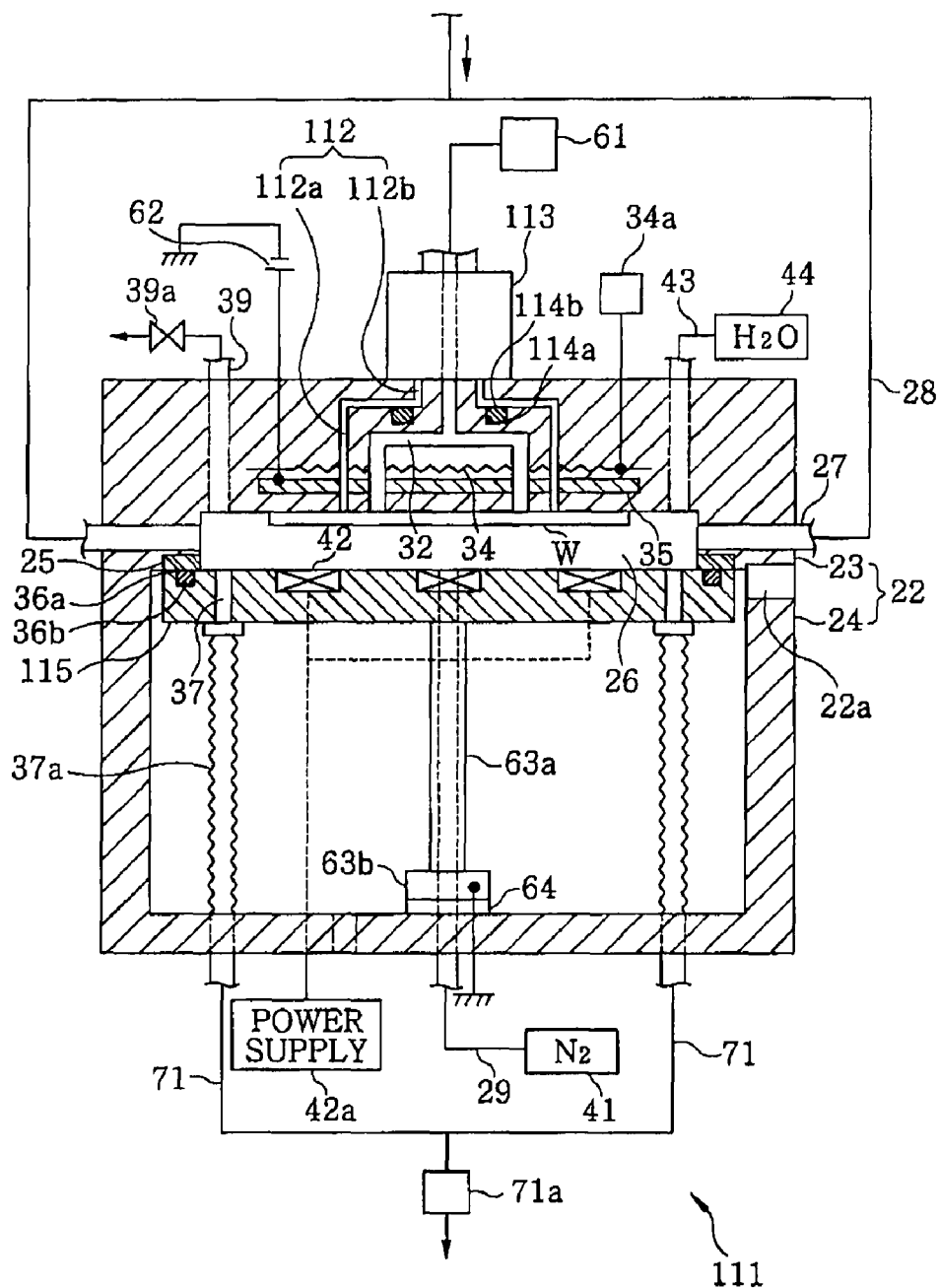
FIG. 14 is a longitudinal cross sectional view showing an example of a processing vessel of the manufacturing apparatus.

The processing vessel 111 shown in FIG. 14 has a configuration more or less obtained by turning the processing vessel 21 shown in FIG. 2 upside down. Here, like reference numerals are used for like parts of the processing vessel 21.

Schematically, in the processing vessel 111, a wafer W is maintained in a processing region 26 in a vertically opposite direction to that in the processing vessel 21 such that its front surface (on which a pattern such as a resist mask 83 or an insulating film 87 is formed) faces downward. That is, the rear surface of the wafer W is attracted and held by a suction member 112 buried in a ceiling wall of an upper member 23. The wafer W is moved up and down on the suction member 112.

To elaborate, the suction member 112 includes a contact member 112a of a cylinder shape having a diameter smaller than that of the wafer W; and a driving shaft 112b connected to the upper side of the contact member 112a and having a diameter smaller than that of the contact member 112a. The driving shaft 112b is supported at a driving mechanism 113 provided outside (above) a housing 22 such that it is inserted through the central portion of the driving mechanism 113. The driving shaft 112b is moved up and down by the driving mechanism 113. Further, a suction path 32 for suctioning a substantially central portion of the wafer W is formed inside the suction member 112 and connected with a suction unit 61 such as a vacuum pump or the like via the driving mechanism 113. A ring-shaped groove 114a is formed at an upper portion of the contact member 112a, and the suction member 112 and the housing 22 are airtightly contacted with each other through a ring-shaped seal member 114b inserted in the groove 114a, so that an inflow of a processing solution into the driving mechanism 113 is prevented. Further, an electrode 35 and a temperature control unit 34 are formed in the upper member 23 in sequence from the bottom such that they are closely located to the wafer W held in place by the suction member 112, and the electrode 35 and the temperature control unit 34 are connected to a power supply 62 and a power supply 34a, respectively. The electrode 35 and the power supply 62 are included in an electric field forming unit. Moreover, the electrode 35 and the temperature control unit 34 are located separately in the inside and the outside of the suction member 112 and they are respectively connected to the power supply 62 and the power supply 34a, however, the illustration therefor is omitted herein.

Further, an elevating plate 115 is provided at a position corresponding to the mounting table 31 of the processing vessel 21 in FIG. 2 so as to face the wafer W. Ultrasonic vibrators 42 are installed at plural positions of the elevating plate 115 as an ultrasonic wave transmitting unit, and ultrasonic vibration is applied to the processing solution in the vicinity of the wafer W in a uniform manner. A elevating mechanism 63b is connected to a bottom surface of the elevating plate 115 via an elevating shaft 63a, and the elevating plate 115 is moved up and down by the elevating mechanism 63 to airtightly form the processing region 26 by firmly adhering a ring-shaped insulator 25 provided at a bottom surface of the upper member 23 to a seal member 36b in a groove 36a, which is formed at a peripheral portion of the elevating plate 115 along its circumference, or to allow a transfer port 22a for the wafer W and the processing region 26 to communicate with each other. Further, an insulator 64 is interposed between the elevating mechanism 63b and the housing 22.

A gas supply line 29 is formed inside the elevating shaft 63a, the elevating mechanism 63b and the insulator 64 and is connected with a gas supply source 41 serving as a gas supply unit which stores therein a clean gas, e.g., a nitrogen gas, for blowing away pure water clinging to the wafer W after the wafer W is processed. Further, a cleaning solution supply unit 44 which stores therein a cleaning solution, e.g., pure water, for cleaning the wafer W is connected to the ceiling of the upper member 23 via a cleaning solution supply line 43. Discharge paths 37 are formed at plural, e.g., four positions inside the elevating plate 115 as liquid passages, and they are connected to a return line 71 via expansible/contractible discharge tubes 37a and the bottom surface of the housing 22.

Provided at a sidewall of the upper member 23 are processing solution supply ports 27 for supplying the processing solution into the processing region 26, and the processing solution supply ports 27 are connected with a processing gas supply line 28 as a liquid supply pathway.

The power supply 62 and the elevating mechanism 63b are grounded.

Figure 15A:
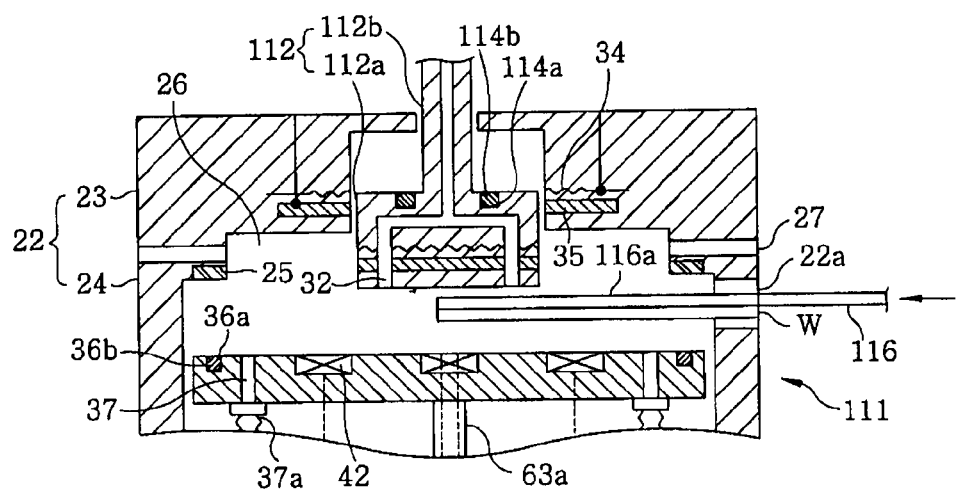
FIGS. 15A to 15C are longitudinal cross sectional views of the processing vessel, for showing a process of loading the substrate into the processing vessel.
Figure 15B:
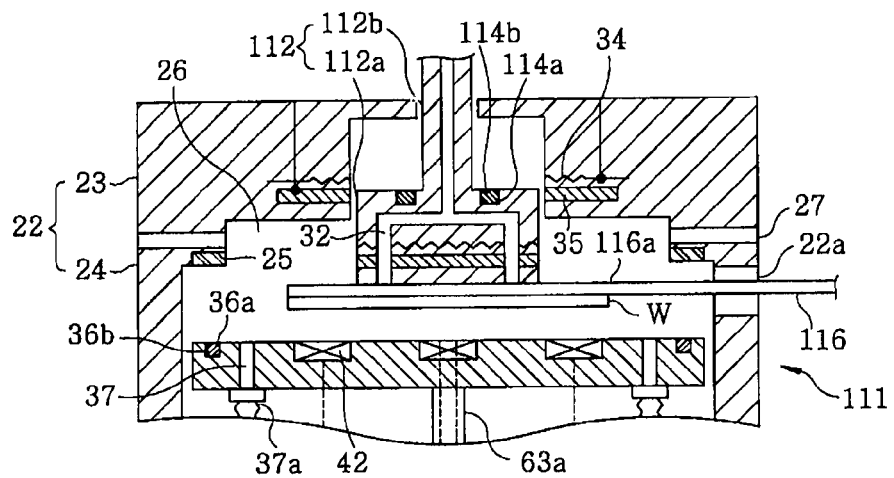
Figure 15C:
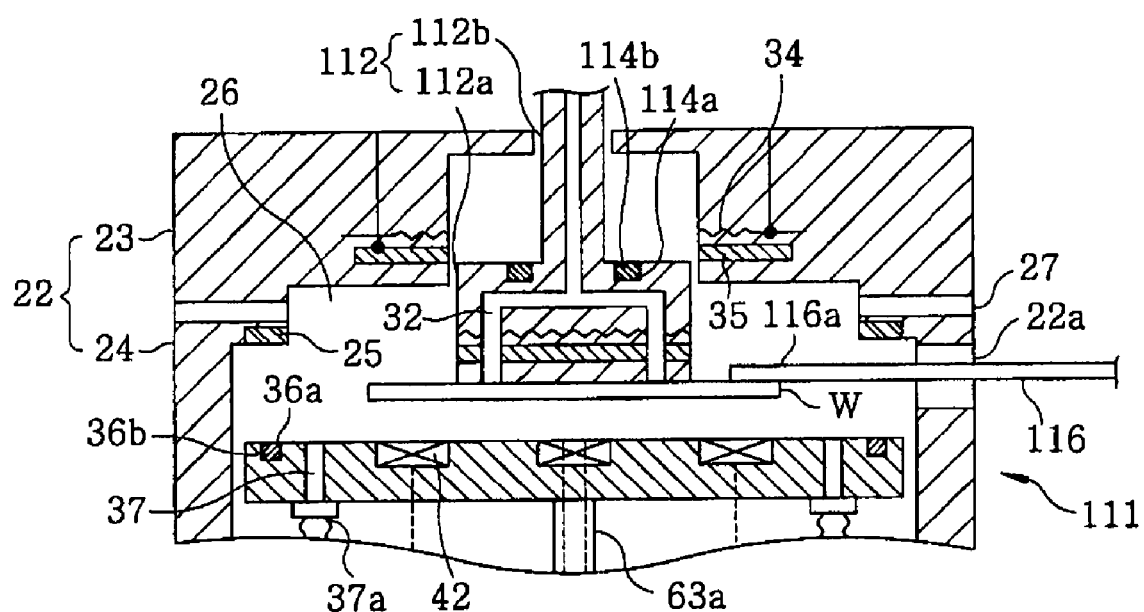

Now, a process of loading the wafer W into the processing vessel 111 will be explained briefly with reference to FIGS. 15A to 15C. First, as shown in FIG. 15A, the elevating plate 115 and the suction member 112 are lowered. Then, the wafer W whose rear surface is attracted and held by an external transfer mechanism 116 having, e.g., a horseshoe-shaped arm 116a and whose front surface is maintained facing downward is loaded into the housing 22 via the transfer port 22a. At this time, only the peripheral portion of the wafer W is supported by the transfer mechanism 116 so that its central portion to be brought into contact with the suction member 112 is not interfered with the transfer mechanism 116. Then, as illustrated in FIG. 15B, if the wafer W is transferred to a central portion of the processing region 26, the suction member 112 is slightly lowered, so that the suction member 112 and the wafer W are allowed to come into contact with each other. Then, the wafer W is attracted and held on the suction member 112 by the suction unit 61, while the transfer mechanism 116 ceases to attract the wafer W, and the transfer mechanism 116 is retreated, as shown in FIG. 15C. Thereafter, the suction member 112 and the elevating plate 115 are raised, whereby the airtight processing region 26 is formed.

Since the subsequent process for processing the wafer W is the same as that of the processing vessel 21 described above, explanation thereof will be omitted herein. If the wafer processing is completed, the wafer W is unloaded in the reverse sequence as it is loaded, and the transfer mechanism 116 is vertically inverted so that the direction of the wafer W is turned back into its original state.

In the processing vessel 111, in case that the buoyancy applied to the nano-bubbles 85 in the processing solution is strong, the buoyancy can be used in addition to the voltage applied to the electrode 35 to attract the nano-bubbles 85 onto the wafer W. Therefore, processing speed can be increased. Furthermore, it may be also possible to perform the processing of the wafer W by using only the buoyancy of the nano-bubbles 85 without having to apply the voltage to the electrode 35.

Further, in the processing vessel 111, although the wafer W is transferred while preventing the transfer mechanism 116 from contacting the front surface (on which the pattern is formed) of the wafer W so as to suppress adherence of particles to the front surface of the wafer W, it may be also possible to transfer the wafer W while supporting the front surface of the wafer W as long as no particular problem is encountered.

Further, in the above-described embodiments, although the negatively charged nano-bubbles 85 are attracted by applying a positive voltage to the wafer W, it may be also possible to push the nano-bubbles 85 toward the wafer W by applying a negative voltage to a surface (upper member 23 or the elevating plate 15) opposite to the wafer W. Further, it may be also possible to charge the nano-bubbles 85 with positive charges and to attract or push them toward the wafer by applying a negative voltage to the wafer W or by applying a positive voltage to the surface opposite to the wafer W.

What is claimed is:

1. A semiconductor device manufacturing method for performing an etching process or a film forming process on a substrate provided with a preset pattern with an opening, for use in a semiconductor device manufacture, the method comprising the steps of:

generating a nano-bubble by mixing a liquid and a gas, at least one of which contains a component contributing to the etching process or the film forming process, the nano-bubble having a diameter smaller than that of the opening formed on the substrate and electrically charged by the mixture of the liquid and the gas;

forming an electric field for attracting the nano-bubbles onto a surface of the substrate; and performing the etching process or the film forming process by supplying the liquid containing the nano-bubble onto the substrate while forming the electric field.

2. The semiconductor device manufacturing method of claim 1, further comprising a step of cleaning the substrate by supplying a cleaning solution onto the substrate after the step of performing the etching process or the film forming process is completed.

3. The semiconductor device manufacturing method of claim 2, further comprising a step of drying the substrate by supplying a drying gas after the step of cleaning the substrate is completed.

4. The semiconductor device manufacturing method of claim 1, wherein the step of performing the etching process or the film forming process includes transmitting an ultrasonic wave to the liquid.

5. The semiconductor device manufacturing method of claim 1, wherein the step of performing the etching process or the film forming process includes controlling the temperature of the substrate.

6. The semiconductor device manufacturing method of claim 1, wherein the liquid is made of a solution containing hydrogen fluoride.

7. The semiconductor device manufacturing method of claim 1, wherein, when the etching process is performed, the gas is made of a gas containing carbon and hydrogen.

8. The semiconductor device manufacturing method of claim 1, wherein, when the film forming process is performed, the liquid is made of a solution containing a metal salt, a complexing agent and a reducing agent.

9. The semiconductor device manufacturing method of claim 1, wherein the etching process or the film forming process is performed with a target surface of the substrate facing down.

10. A semiconductor manufacturing apparatus for performing an etching process or a film forming process on a substrate provided with a preset pattern with an opening, for use in a semiconductor device manufacture, comprising:

a processing vessel accommodating a mounting table for mounting the substrate thereon;

a liquid supply line of which one end is connected to the processing vessel;

a nano-bubble generating unit installed in the liquid supply line, for generating a nano-bubble electrically charged in a liquid by mixing a gas with the liquid supplied into the liquid supply line;

an electric field generating unit for generating an electric field to attract the nano-bubble in the liquid, which is supplied into the processing vessel from the liquid supply line, onto the surface of the substrate mounted on the mounting table; and a liquid discharge line for discharging the liquid from the processing vessel, wherein at least one of the liquid and the gas contains a component contributing to the etching process or the film forming process.

11. The semiconductor manufacturing apparatus of claim 10, further comprising a cleaning solution supplying unit for supplying a cleaning solution onto the substrate mounted on the mounting table in the processing vessel.

12. The semiconductor manufacturing apparatus of claim 11, further comprising a gas supplying unit for supplying a drying gas onto the substrate cleaned by the cleaning solution supplied from the cleaning solution supply unit.

13. The semiconductor manufacturing apparatus of claim 10, further comprising an ultrasonic wave transmitting unit for transmitting an ultrasonic wave to the liquid supplied into the processing vessel.

14. The semiconductor manufacturing apparatus of claim 10, wherein a temperature controller for controlling the temperature of the substrate mounted on the mounting table is disposed in the processing vessel.

15. The semiconductor manufacturing apparatus of claim 10, wherein a filter for adjusting the diameter of the nano-bubble passing therethrough is disposed between the processing vessel and the nano-bubble generating unit.

16. A storage medium which stores therein a computer program for executing, on a computer, a method for performing an etching process or a film forming process on a substrate provided with a preset pattern with an opening, for use in a semiconductor device manufacture, wherein the method for performing the etching process or the film forming process comprises the steps of:

generating a nano-bubble by mixing a liquid and a gas, at least one of which contains a component contributing to the etching process or the film forming process, the nano-bubble having a diameter smaller than that of the opening formed on the substrate and electrically charged by the mixture of the liquid and the gas;

forming an electric field for attracting the nano-bubbles onto a surface of the substrate; and performing the etching process or the film forming process by supplying the liquid containing the nano-bubble onto the substrate while forming the electric field.

* * * * *